(12) United States Patent
Nagata et al.

(10) Patent No.: US 10,014,199 B2
(45) Date of Patent: Jul. 3, 2018

(54) WAFER BOAT SUPPORT TABLE AND HEAT TREATMENT APPARATUS USING THE SAME

(71) Applicant: TOKYO ELECTRON LIMITED, Tokyo (JP)

(72) Inventors: Tomoyuki Nagata, Oshu (JP); Tomoya Hasegawa, Oshu (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 0 days.

(21) Appl. No.: 15/352,816

(22) Filed: Nov. 16, 2016

(65) Prior Publication Data

US 2017/0140964 A1    May 18, 2017

(30) Foreign Application Priority Data

Nov. 18, 2015   (JP) .................... 2015-225407

(51) Int. Cl.
| | |
|---|---|
| *H01L 21/67* | (2006.01) |
| *H01L 21/673* | (2006.01) |
| *H01L 21/677* | (2006.01) |

(52) U.S. Cl.
CPC .. *H01L 21/67303* (2013.01); *H01L 21/67757* (2013.01); *H01L 21/67769* (2013.01); *H01L 21/67775* (2013.01); *H01L 21/67781* (2013.01)

(58) Field of Classification Search
CPC .............. H01L 21/67303; H01L 21/67757
USPC ................. 414/172; 211/41.1, 41.12, 41.18; 118/253, 259; 206/307, 710, 832
See application file for complete search history.

(56) References Cited

U.S. PATENT DOCUMENTS

| | | | | |
|---|---|---|---|---|
| 4,738,618 | A * | 4/1988 | Massey ................... | C30B 35/00 414/940 |
| 5,404,894 | A * | 4/1995 | Shiraiwa ........... | H01L 21/67167 118/500 |
| 5,458,688 | A * | 10/1995 | Watanabe ............... | C30B 31/14 118/724 |
| 5,711,808 | A * | 1/1998 | Yang ..................... | F27D 5/0037 118/500 |
| 5,743,967 | A * | 4/1998 | Kobori ................ | C23C 16/4585 118/500 |
| 5,779,203 | A * | 7/1998 | Edlinger ........... | H01L 21/67775 248/178.1 |
| 6,065,615 | A * | 5/2000 | Uchiyama ......... | H01L 21/67303 118/500 |

(Continued)

FOREIGN PATENT DOCUMENTS

| | | | |
|---|---|---|---|
| EP | 0 843 338 A1 * | 5/1998 | ............ H01L 21/00 |
| JP | 1375368 D | 12/2009 | |

(Continued)

*Primary Examiner* — Douglas A Hess
(74) *Attorney, Agent, or Firm* — Nath, Goldberg & Meyer; Jerald L. Meyer

(57) ABSTRACT

There is provided a wafer boat support table that supports a wafer boat having a plurality of posts from below, the plurality of posts being configured to arrange and support a plurality of wafers at intervals in a vertical direction, the wafer boat support table including: a plurality of support points installed on each of linear lines defined by connecting a center of the wafer boat and the plurality of posts and configured to support a bottom surface of the wafer boat while being brought into contact with the bottom surface of the wafer boat.

18 Claims, 21 Drawing Sheets

(56) References Cited

U.S. PATENT DOCUMENTS

| | | | | |
|---|---|---|---|---|
| 6,095,806 | A * | 8/2000 | Suzuki | C23C 16/4583 211/41.18 |
| 6,341,935 | B1 * | 1/2002 | Tseng | H01L 21/67303 118/500 |
| 6,759,336 | B1 * | 7/2004 | Chebi | B08L 37/0071 414/935 |
| 7,210,924 | B2 * | 5/2007 | Mochizuki | F27B 5/04 211/41.18 |
| 7,661,544 | B2 * | 2/2010 | Herzog | H01L 21/67309 211/41.18 |
| 8,067,820 | B2 * | 11/2011 | Kihara | C30B 29/06 118/500 |
| 8,591,700 | B2 * | 11/2013 | Gatchalian | C23C 16/4584 118/500 |
| 9,142,411 | B2 * | 9/2015 | Tsujimura | H01L 21/046 |
| 9,153,466 | B2 * | 10/2015 | Jdira | H01L 21/67303 |
| 9,803,796 | B2 * | 10/2017 | Yu | F16M 13/00 |
| 2016/0093487 | A1 * | 3/2016 | Huussen et al. | |

FOREIGN PATENT DOCUMENTS

| | | | |
|---|---|---|---|
| JP | 1375370 D | 8/2011 | |
| WO | WO 2006/118774 A2 * | 11/2006 | C23C 16/00 |

\* cited by examiner

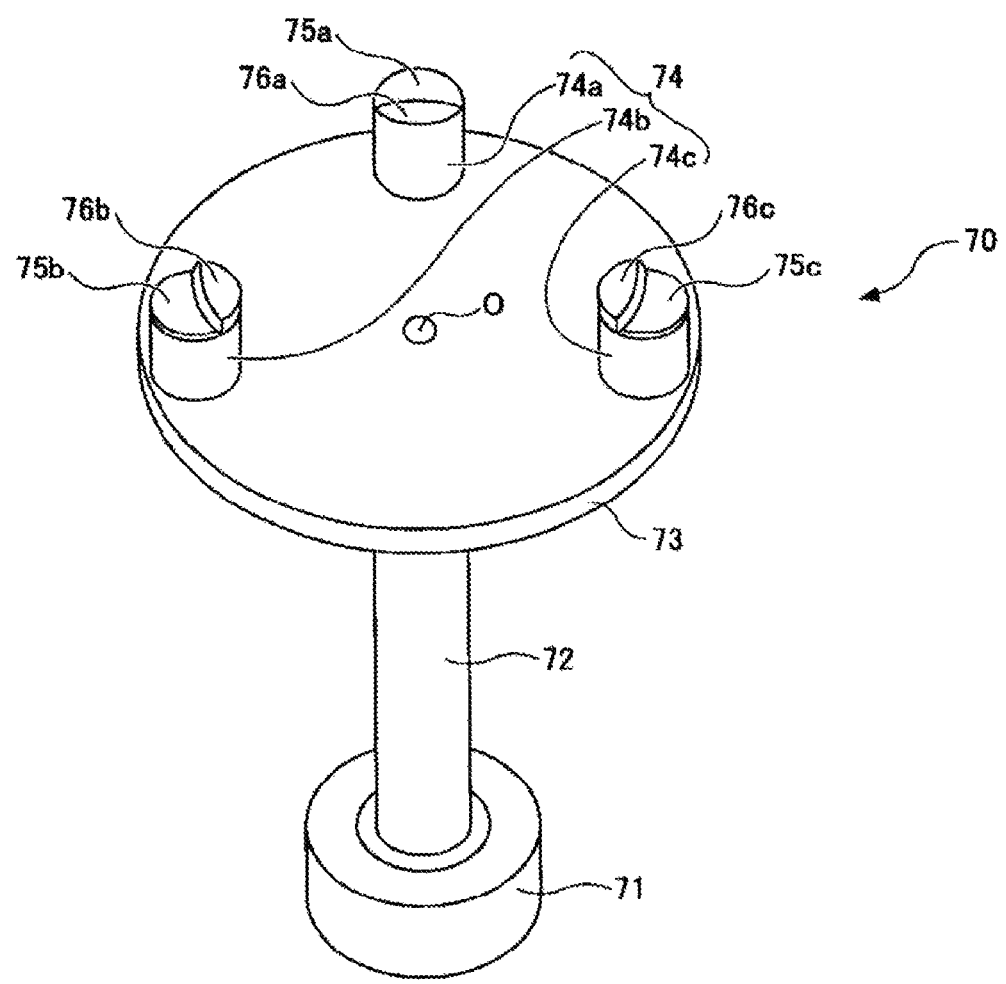

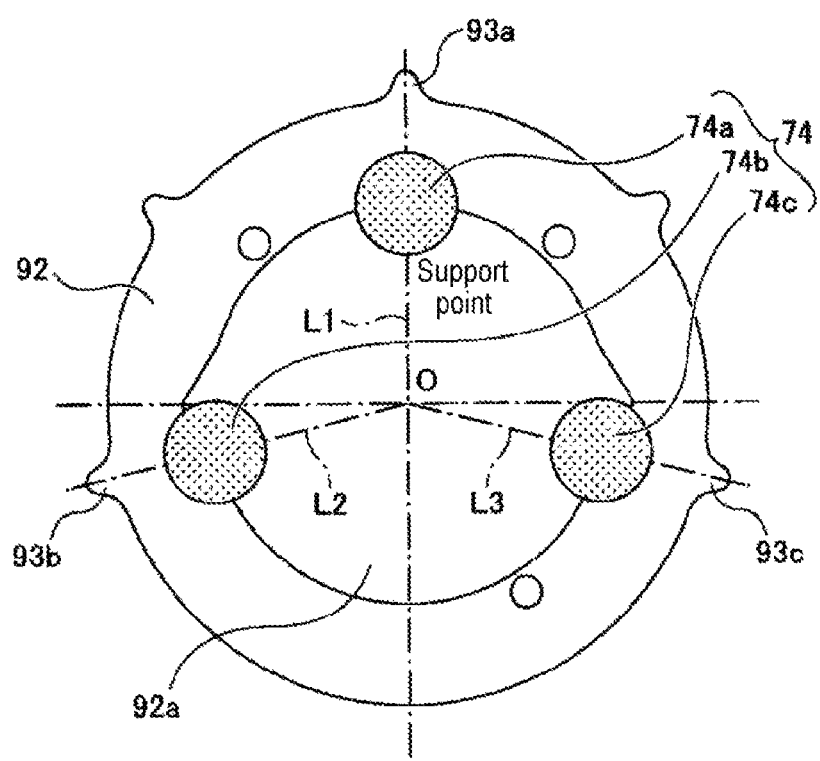

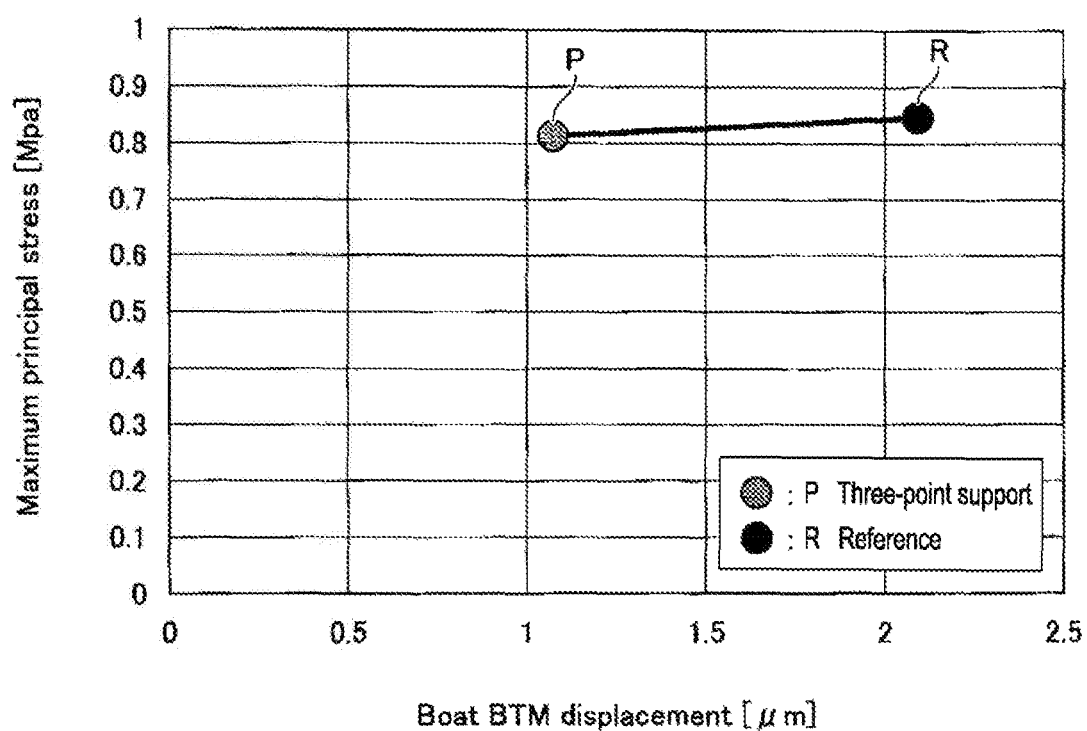

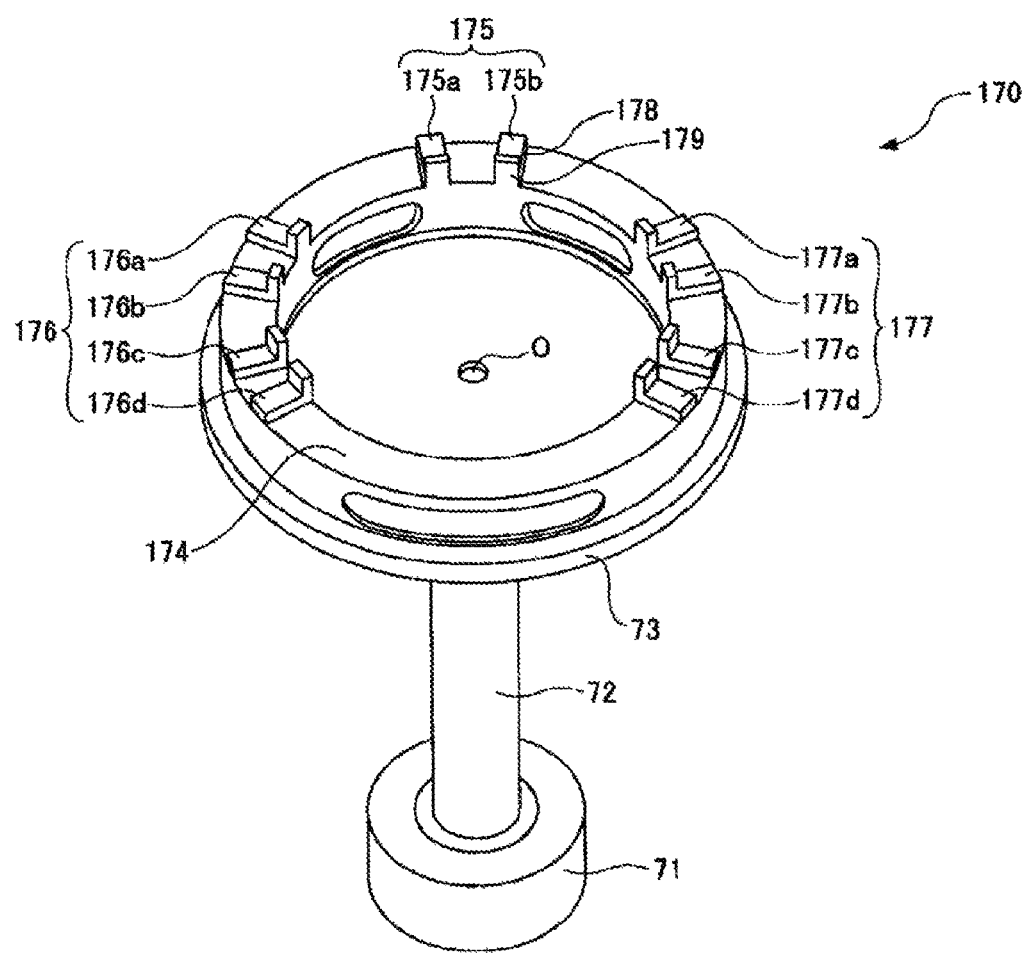

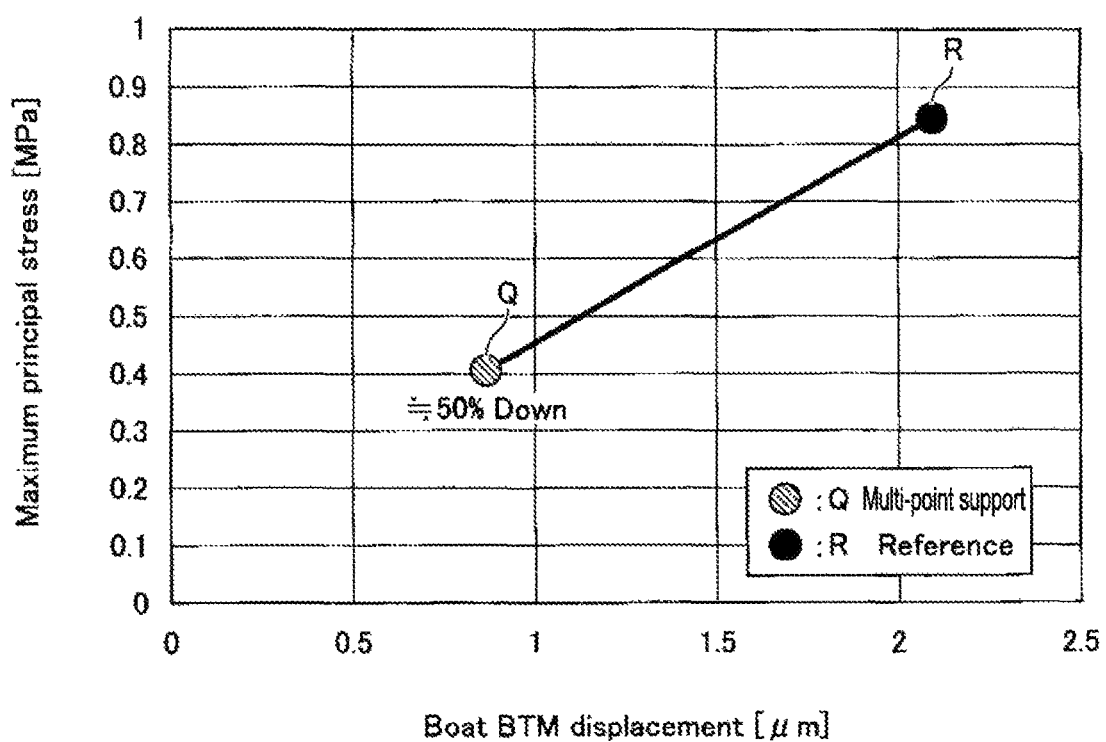

Best in terms of analysis

WAFER BOAT SUPPORT TABLE AND HEAT TREATMENT APPARATUS USING THE SAME

CROSS-REFERENCE TO RELATED APPLICATION

This application claims the benefit of Japanese Patent Application No. 2015-225407, filed on Nov. 18, 2015, in the Japan Patent Office, the disclosure of which is incorporated herein in its entirety by reference.

TECHNICAL FIELD

The present disclosure relates to a wafer boat support table and a heat treatment apparatus using the same.

BACKGROUND

Conventionally, among wafer boat support tables that support a wafer boat having a plurality of posts from below, the posts being configured to arrange and support a plurality of wafers at intervals in a vertical direction, one that supports a bottom surface of the wafer boat at four support points is known. In such a wafer boat support table, locking structures formed at inner sides of the four support points are locked to an opening of the wafer boat having an annular ring-shaped bottom surface. Each of the support points supports the bottom surface of the wafer boat through support surfaces formed at outer sides of the support points while being into contact with the bottom surface of the wafer boat.

Further, a wafer boat support table having an annular ring-shaped support surface is known. Such a wafer boat support table having an annular ring-shaped support surface disperses a load to be applied to the support surface and also disperses stress to be imposed on a unit area.

In general, both a wafer boat and a wafer boat support table are often formed of quartz. Thus, in most cases, there is no difference in thermal expansion coefficients between the wafer boat and the wafer boat support table.

However, in recent years, in a semiconductor manufacturing process, a process is often performed using a wafer boat made of SiC in view of reducing rod mark particles. In this process, a wafer boat support table is formed of quartz so that the wafer boat made of SiC and the wafer boat support table made of quartz have different thermal expansion coefficients. This causes particles from a surface at which the wafer boat support table is brought into contact with the wafer boat, which may fail to meet the needs of the next-generation particle specification, in which a demand for higher specification is increasing.

SUMMARY

Some embodiments of the present disclosure provide a wafer boat support table capable of sufficiently suppressing generation of particles even if the wafer boat support table and a wafer boat are made of different materials, and a heat treatment apparatus using the same.

According to one embodiment of the present disclosure, there is provided a wafer boat support table that supports a wafer boat having a plurality of posts from below, the plurality of posts being configured to arrange and support a plurality of wafers at intervals in a vertical direction, the wafer boat support table including: a plurality of support points installed on each of linear lines defined by connecting a center of the wafer boat and the plurality of posts and configured to support a bottom surface of the wafer boat while being brought into contact with the bottom surface of the wafer boat.

According to another embodiment of the present disclosure, there is provided a heat treatment apparatus, including: the aforementioned wafer boar support table; a wafer transfer part configured to load a wafer into a wafer boat supported by the wafer boat support table; a heat processing furnace disposed on the wafer boat support table; and an elevating mechanism configured to load the wafer boat supported by the wafer boat support table into the heat processing furnace.

According to yet another embodiment of the present disclosure, there is provided a wafer boat support table that supports a wafer boat having a plurality of posts from below, the plurality of posts being configured to arrange and support a plurality of wafers at intervals in a vertical direction, the wafer boat support table including, a plurality of support points disposed around each of linear lines defined by connecting a center of the wafer boat and the plurality of posts and configured to support a bottom surface of the wafer boat while being brought into contact with the bottom surface of the wafer boat.

According to still another embodiment of the present disclosure, there is provided a heat treatment apparatus, including: the aforementioned wafer boar support table; a wafer transfer part configured to load a wafer into a wafer boat supported by the wafer boat support table; a heat processing furnace disposed on the wafer boat support table; and an elevating mechanism configured to load the wafer boat supported by the wafer boat support table into the heat processing furnace.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 5A and 5B are views illustrating an example of a wafer boat support table according to a first embodiment of the present disclosure, FIG. 5A being a perspective view illustrating a configuration of an example of the wafer boat support table according to the first embodiment of the present disclosure and FIG. 5B being a view illustrating an example of a layout configuration of support points of the wafer boat support table according to the first embodiment of the present disclosure.

FIG. 9 is a view illustrating a simulation analysis result of a relationship between a displacement of a bottom surface of a wafer boat and a maximum stress value in the first embodiment.

FIGS. 11A and 11B are views illustrating an example of a wafer boat support table according to a second embodiment of the present disclosure, FIG. 11A being a perspective view illustrating a configuration of an example of the wafer boat support table according to the second embodiment of the present disclosure and FIG. 11B being a view illustrating an example of a support point group and a layout configuration of respective support points.

FIG. 13 is a view illustrating a simulation analysis result of a relationship between a displacement of a bottom surface of the wafer boat table and a maximum stress value in the second embodiment.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Heat Treatment Apparatus]

Figure 1:
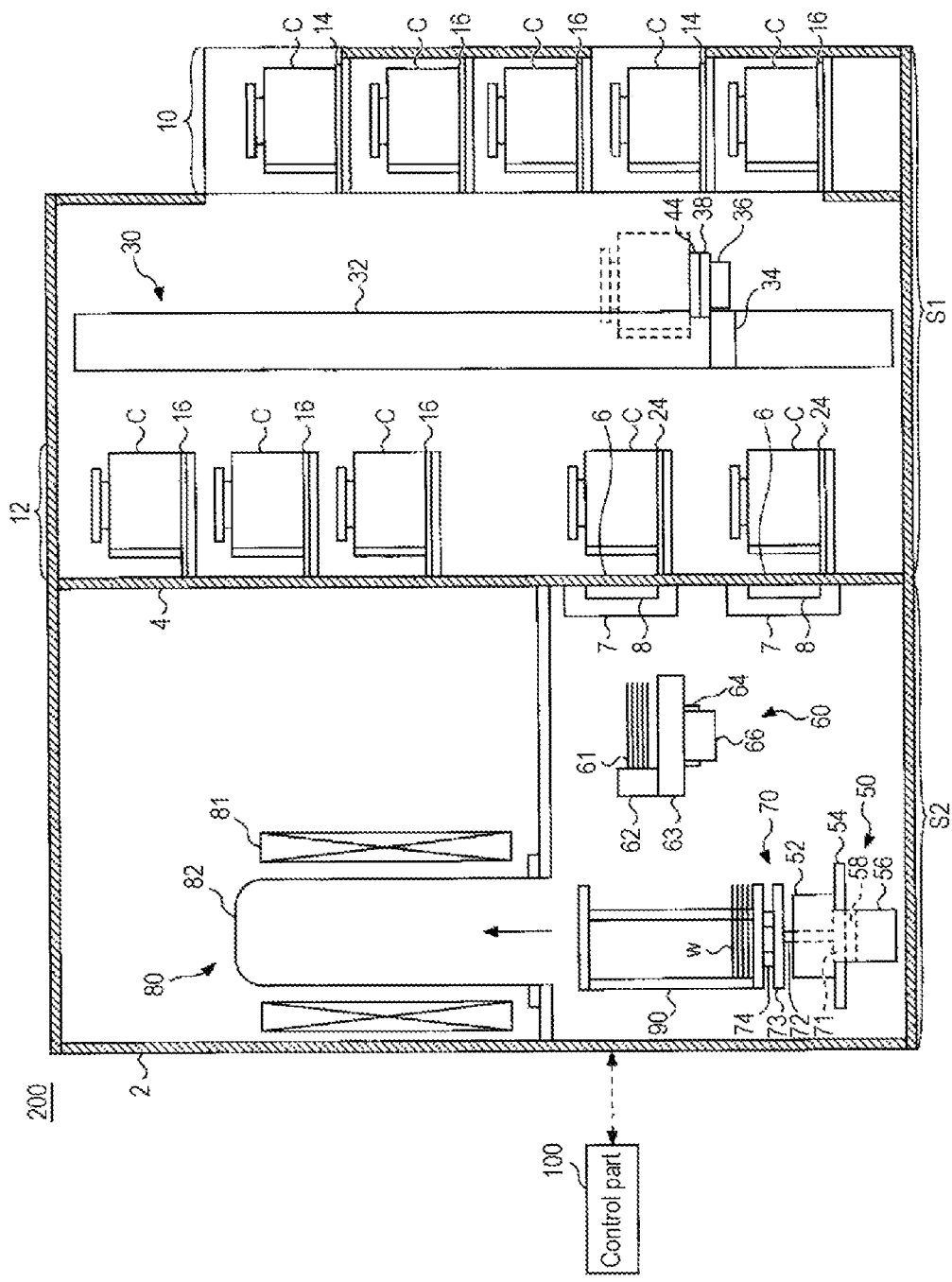
FIG. 1 is a schematic configuration view illustrating a configuration of an example of a heat treatment apparatus according to an embodiment of the present disclosure.
Figure 2:
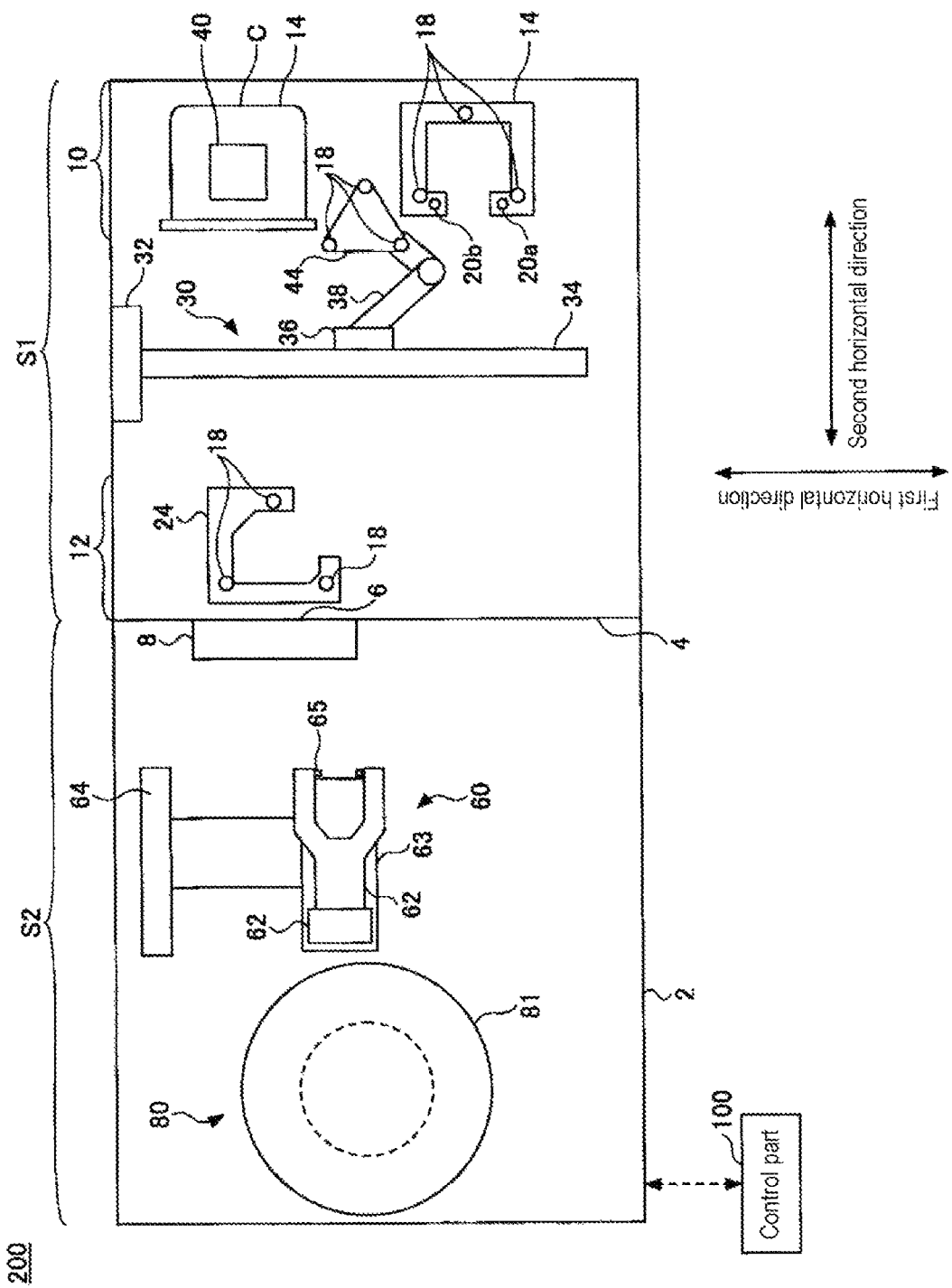
FIG. 2 is a schematic plane view illustrating an example of the heat treatment apparatus according to the embodiment of the present disclosure.
Figure 3:
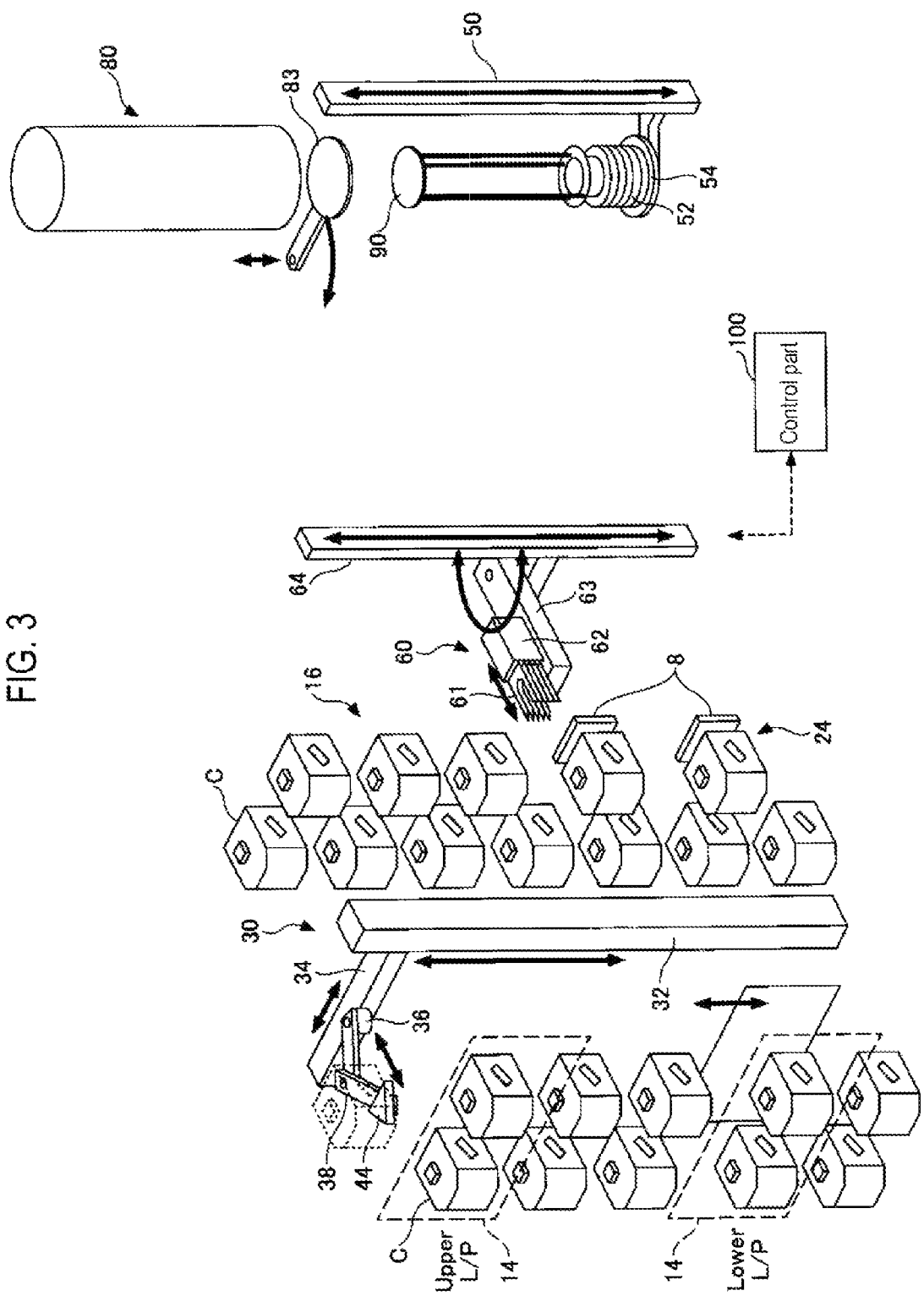
FIG. 3 is a schematic perspective view of a layout configuration of an example of the heat treatment apparatus according to the embodiment of the present disclosure.

First, a configuration example of a heat treatment apparatus according to an embodiment of the present disclosure to which a wafer boat support table according to an embodiment of the present disclosure is applied will be described. FIG. 1 illustrates a schematic configuration view of an example of the heat treatment apparatus according to an embodiment of the present disclosure. FIG. 2 illustrates a schematic plane view of an example of the heat treatment apparatus according to the embodiment of the present disclosure. FIG. 3 is a schematic perspective view of a layout configuration of an example of the heat treatment apparatus according to the embodiment of the present disclosure. Further, in FIG. 2, for the sake of convenience in description, a state where a carrier C is not mounted on one side of a load port 14 and an FIMS port 24 of FIG. 1 is illustrated.

As illustrated in FIG. 1, a heat treatment apparatus 200 is configured to be accommodated in a housing 2 constituting an external body of the heat treatment apparatus 200. The housing 2 is divided into a carrier transfer region S1 and a wafer transfer region S2. In the carrier transfer region S1, a carrier C as a vessel that accommodates a semiconductor wafer W (hereinafter, referred to as a "wafer W") as a target object is loaded into or unloaded from the heat treatment apparatus 200. In the wafer transfer region S2, the wafer W accommodated in the carrier C is transferred and loaded into a heat processing furnace 80 to be described later.

In the course of transferring the wafer W, in order to prevent adhesion of a foreign substance to a surface of the wafer W or formation of a natural oxide film, the semiconductor wafer is received within a substrate receiving vessel called a front-opening unified pod (FOUP) and cleanness of the interior of the vessel is kept at a predetermined level. Hereinafter, the substrate receiving vessel will be referred to as a carrier C.

The carrier transfer region S1 and the wafer transfer region S2 are partitioned by a partition wall 4. The carrier transfer region S1 is a region under an air atmosphere. In the carrier transfer region S1, the carrier C in which the wafer W is accommodated is transferred between component parts (to be described later) provided inside the heat treatment apparatus 200. That is to say, the carrier transfer region S1 is a region where the carrier C is loaded into the heat treatment apparatus 200 from the outside or where the carrier C is unloaded from a substrate processing apparatus to the outside. Meanwhile, the wafer transfer region S2 is a region where the wafer W is extracted from the carrier C and various processes are performed on the wafer W. The wafer transfer region S2 is under an inert gas atmosphere, for example, a nitrogen ($N_2$) gas atmosphere, in order to prevent formation of an oxide film on the wafer W. In the following description, a direction in which the carrier transfer region S1 and the wafer transfer region S2 are arranged will be referred to as a forward-backward direction (corresponding to a second horizontal direction to be described later). The carrier transfer region S1 side will be referred to as a forward direction and the wafer transfer region S2 side will be referred to as a backward direction. Further, a horizontal direction perpendicular to the forward-backward direction will be referred to as a left-right direction (corresponding to a first horizontal direction to be described later).

In some embodiments, a filter unit such as a high efficiency particulate air (HEPA) filter or an ultra low penetration air (ULPA) filter (not shown) may be installed in a ceiling portion or a sidewall portion of the wafer transfer region S2. Air purified by such a filter may be supplied.

A transfer port 6 through which the wafer W is transferred between the carrier transfer region S1 and the wafer transfer region S2 is formed in the partition wall 4. The transfer port 6 is opened and closed by a door mechanism 8 that complies with a front-opening interface mechanical standard (FIMS).

The carrier transfer region S1 will be described. The carrier transfer region S1 includes a first transfer region 10 and a second transfer region 12 positioned at the rear side of the first transfer region 10.

As illustrated in FIG. 1, for example, load ports 14 are installed in two upper and lower stages in each of which two load ports 14 are disposed at left and right sides in the first transfer region 10 (see FIG. 2). The load port 14 is a mounting table on which the carrier C is to be mounted, when the carrier C is loaded into the heat treatment apparatus 200.

The load ports 14 are installed at places where the wall of the housing 2 is opened. Through the load ports 14, the carrier C is accessible to the heat treatment apparatus 200 from the outside. Specifically, by a transfer device (not shown) installed outside the heat treatment apparatus 200 according to the present embodiment, the carrier C can be loaded and mounted on the load port 14, and can be unloaded from the load port 14 to the outside. Further, the load ports 14 are provided in, for example, the two upper and lower stages, so that the carrier C can be transferred at two sides.

In some embodiments, a stoker 16 may be installed below each of the load ports 14 disposed in the upper and lower stages in the first transfer region 10 to keep the carrier C therein.

As illustrated in FIG. 2, positioning pins 18 for positioning the carrier C are installed at, for example, three places, on a surface of the load port 14 on which the carrier C is mounted. Further, in a state where the carrier C is mounted on the load port 14, the load port 14 may be moved in the forward-backward direction.

As illustrated in FIG. 1, two FIMS ports 24 are disposed in a lower portion of the second transfer region 12 in a vertical direction. The FIMS port 24 is a holding table that holds the carrier C when the wafer W accommodated in the carrier C is loaded into and unloaded from the heat processing furnace 80 (to be described later) in the wafer transfer region S2. The FIMS port 24 is configured to be moved in the forward-backward direction. As illustrated in FIG. 2, the positioning pins 18 for positioning the carrier C are also installed at three places on a mounting surface of the FIMS port 24, like the load port 14.

Stokers 16 for keeping the respective carriers C are installed in an upper portion of the second transfer region 12. The stokers 16 are configured to have a shelf shape in two or more stages (three stages in the example illustrated in FIG. 1). Each of the shelves is configured to mount two or more carriers C thereon in the left-right direction. In some embodiments, the stoker 16 may be disposed even in a region where a carrier mounting table is not disposed in the lower portion of the second transfer region 12.

A carrier transfer mechanism 30 for transferring the carrier C between the load ports 14, the FIMS ports 24 and the stokers 16 is installed between the first transfer region 10 and the second transfer region 12.

As illustrated in FIG. 2, the carrier transfer mechanism 30 includes a first guide part 32 formed to extend in the vertical direction, a second guide part 34 connected to the first guide part 32 and formed to extend in the left-right direction (the first horizontal direction), a moving part 36 configured to move in the left-right direction while being guided by the second guide part 34, and a joint (or multi-join) arm part 38 (two arm parts having one joint in the example illustrated in FIG. 2) installed in the moving part 36.

Further, as illustrated in FIGS. 1 and 2, a hand portion 44 is installed at a front end of the multi-joint arm part 38. The pins 18 for positioning the carrier C are respectively installed at three places of the hand portion 44.

As described above, the transfer port 6 of the wafer W, through which the carrier transfer region S1 and the wafer transfer region S2 is in communication with each other, is formed in the partition wall 4. A door mechanism 8 for blocking the transfer port 6 from the wafer transfer region S2 side is installed in the transfer port 6. A driving mechanism of a lid opening/closing device 7 is connected to the door mechanism 8. The door mechanism 8 is configured to move in the forward-backward direction and the left-right direction by the driving mechanism, thus opening and closing the transfer port 6.

Next, the wafer transfer region S2 will be described.

The vertical heat processing furnace 80 with an opened lower end as a furnace opening is installed in the wafer transfer region S2. The heat processing furnace 80 includes a process vessel 82 configured to accommodate a plurality of wafers W and perform a heat treatment on the wafers W. Below the heat processing furnace 80, a wafer boat 90 configured to hold the plurality of wafers W in a shelf-like manner is supported by a wafer boat support table 70.

The wafer boat support table 70 is a support means for supporting the wafer boat 90 from below, and is mounted on a hub 58 that is installed at an upper end of a rotary shaft 56 of an elevating mechanism 50. The wafer boat support table 70 includes a base portion 71 mounted on the hub 58, and a support shaft 72 extending upward from the center of the base portion 71. A support board 73 is installed in an upper end of the support shaft 72. A plurality of support points 74 is installed on an upper surface of the support board 73. The wafer boat 90 is supported on the support points 74. The wafer boat support table 70 is formed of, for example, quartz.

Further, a heat insulating tube 52 is installed on a lid 54 to surround the support shaft 72.

The lid 54 is supported by the elevating mechanism 50 illustrated in FIGS. 1 and 3. The wafer boat 90 is loaded into and unloaded from the heat processing furnace 80 by the elevating mechanism 50.

The wafer boat 90 is made of, for example, SiC. The wafer boat 90 is configured such that the wafers W having a large diameter of, for example, 450 mm, 300 mm, or the like, is horizontally held at a predetermined interval in the vertical direction. In general, the number of the wafers W accommodated in the wafer boat 90 is not limited and may be, for example, about 50 to 150 sheets. Further, while in this embodiment, as an example, the wafer boat 90 has been described to be formed of SiC differing from a material of the wafer boat support table 70 made of quartz, the wafer boat support table 70 according to this embodiment may be applied even in the case where the wafer boat 90 is made of quartz. Thus, the material of the wafer boat 90 is not limited to SiC.

A wafer transfer device 60 is installed between the wafer boat 90 and the transfer port 6 of the partition wall 4. As illustrated in FIGS. 1 to 3, the wafer transfer device 60 is to move the wafer W between the carrier C supported on the FIMS port 24 and the wafer boat 90.

The wafer transfer device 60 includes a rectangular guide mechanism 63, a moving body 62 installed to move forward and backward along a longitudinal direction on the guide mechanism 63, and five forks 61 installed in the moving body 62. The guide mechanism 63 is attached to the elevating mechanism 64 formed to extend in a vertical direction. The guide mechanism 63 is configured to move in the vertical direction by the elevating mechanism 64 and to rotate by a rotary mechanism 66.

Further, as illustrated in FIG. 1, the heat processing furnace 80 includes the cylindrical process vessel 82 made of quartz and a cylindrical heater 81 disposed around the process vessel 82. The process vessel 82 performs the heat treatment on the accommodated wafers W through a heating process performed by the heater 81. In addition, a shutter 83 is installed below the process vessel 82. The shutter 83 serves as a door for covering a lower end portion of the heat processing furnace 80 during a period of time between the unloading of the wafer boat 90 from the heat processing furnace 80 and the subsequent loading of the wafer boat 90 into the heat processing furnace 80.

As illustrated in FIGS. 1 to 3, a control part 100 is installed to perform the overall control of the heat treatment apparatus 200. The control part 100 controls operations of various devices of the heat treatment apparatus 200 to perform the heat treatment under various processing conditions set in a recipe. Further, the control part 100 receives signals from various sensors installed within the heat treatment apparatus 200, recognizes a position of the wafer W or the like, and performs a sequence control for implementing a process. In some embodiments, the control part 110 may receive physical measurement values or the like detected by various detectors installed within the heat treatment apparatus 200, recognize a state of the substrate process, and perform a feedback control or the like required to appropriately perform the substrate process.

To do this, the control part 100 may include a calculation means and a storage means such as a central processing unit (CPU), a read only memory (ROM), and a random access memory (RAM), and may be configured as a microcomputer that installs a program for performing a process of a recipe from a storage medium storing the program to execute the process of the recipe. Alternatively, the control part 100 may be configured as an electronic circuit such as an application specific integrated circuit (ASIC).

[Wafer Boat]

Figure 4:
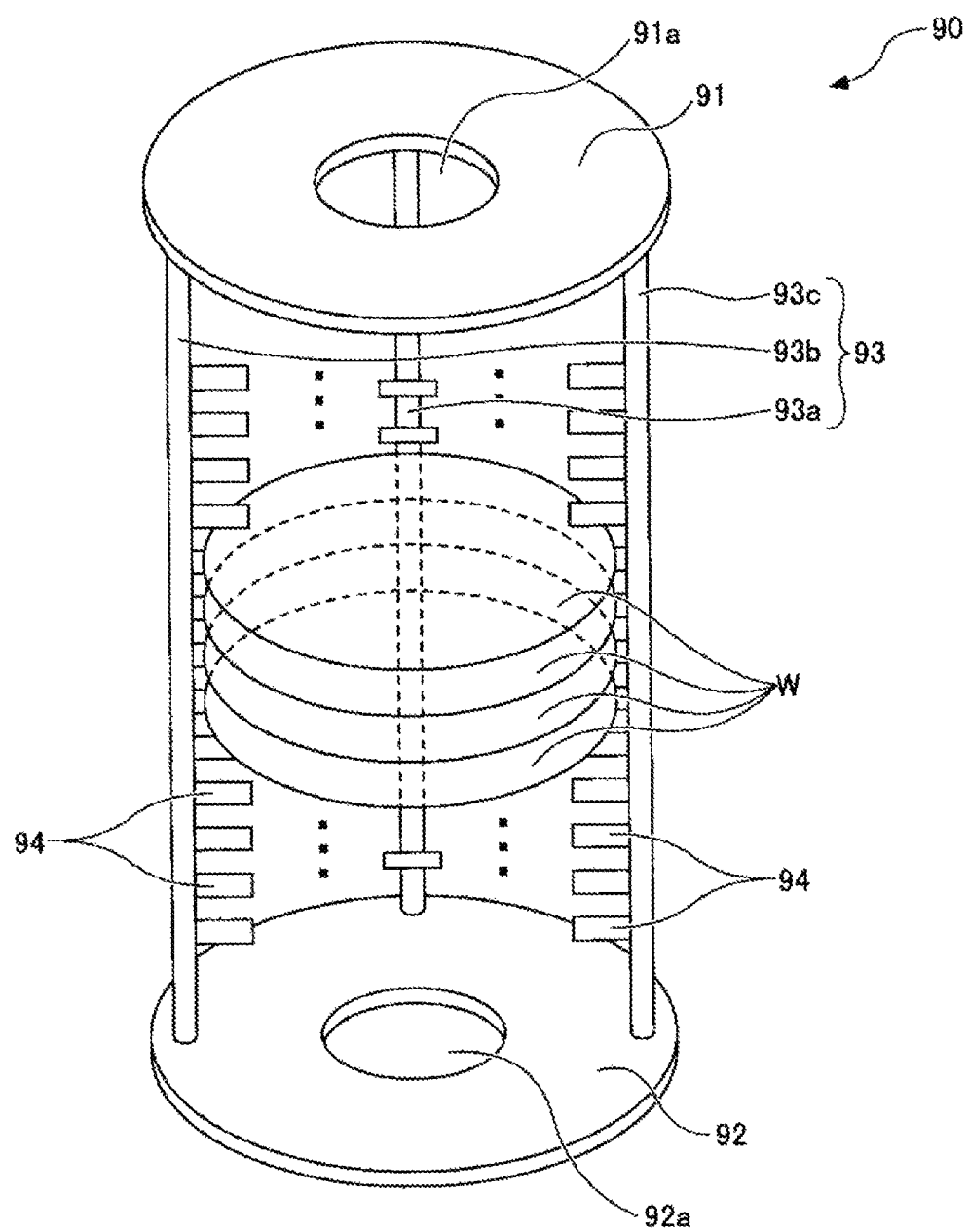
FIG. 4 is a view illustrating an example of a wafer boat usable in a wafer boat support table and the heat treatment apparatus according to an embodiment of the present disclosure.

Next, an example of the wafer boat 90 used in the wafer boat support table 70 and the heat treatment apparatus 200 according to the embodiment of the present disclosure will be described with reference to FIG. 4. FIG. 4 is a view illustrating an example of the wafer boat 90 that can be used in the water boat support table 70 and the heat treatment apparatus 200 according to the embodiment of the present disclosure.

As illustrated in FIG. 4, the wafer boat 90 includes a ceiling plate 91, a bottom plate 92, and a post 93 installed between the ceiling plate 91 and the bottom plate 92. In FIG. 4, three posts 93 are installed. The number of the posts 93 may be variously set to three or more as usage. For example, four posts 93 may be installed.

Each of the posts 93 includes support portions 94 formed in a vertical direction at a predetermined interval. An interval between the support portions 94 may be appropriately set as usage. As an example, as mentioned above, the interval between the support portions 94 may be set at an interval at which 50 to 150 sheets of wafers W are arranged inside a single wafer boat 90. The support portion 94 may be formed in any shape as long as it can support the wafers W. For example, the support portion 94 may be formed in a rectangular shape having a horizontal surface extending in a central direction. Further, the support portions 94 of each of the posts 93 are set to have the same height as those of the respective support portions of another post such that they can support the respective wafers W in a horizontal state. In addition, when three posts 93 are provided, one post 93a is disposed inward of the center when viewed from the front side at which the wafer W is loaded, and the other two posts 93b and 93c are disposed symmetrically with respect to the post 93a.

The ceiling plate 91 and the bottom plate 92 may be formed in an annular shape having an opening 91a and an opening 92a in the central region, respectively, details of which will be described later. The support points 74 of the wafer boat support table 70 are configured to have a structure in which the wafer boat 90 is positioned and fixed using the opening 92a of the bottom plate 92. Thus, the ceiling plate 91 and the bottom plate 92 may have the openings 91a and 92a, respectively.

In some embodiments, the wafer boat 90 may include a reinforcing pillar as necessary, in addition to the posts 93. The reinforcing pillar does not have the support portions 94 for supporting the wafer W, but is a support pillar installed for reinforcement to increase the strength of the wafer boat 90. As an example, a single reinforcing pillar may be installed between the inner central post 93a and the left post 93b and between the inner central post 93a and the right post 93c, respectively.

Moreover, in the present embodiment, there has been described the case where the wafer boat 90 is formed of SiC, but the wafer boat 90 may be formed of quartz, which is the same material as that of the wafer boat support table 70, and may be formed of various materials as usage.

[Wafer Boat Support Table]

Next, the wafer boat support table 70 according to the embodiment of the present disclosure will be described.

FIGS. 5A and 5B are views illustrating an example of the wafer boat support table 70 according to a first embodiment of the present disclosure. FIG. 5A is a perspective view illustrating a configuration of an example of the wafer boat support table 70 according to the first embodiment of the present disclosure. FIG. 5B is a view illustrating an example of a layout configuration of the support point 74.

As illustrated in FIG. 5A, the wafer boat support table 70 according to the first embodiment includes a base portion 71, a support shaft 72, a support board 73, and a support point 74. The support shaft 72 extends upward from the center of the base portion 71 and supports the circular support board 73 at the center O.

Three support points 74 are installed on a surface of the support board 73. The support point 74 includes a central support point 74a installed inward beyond the center O when viewed from the front side, and a left support point 74b and a right support point 74c which are installed at left and right sides symmetrically with respect to the central support point 74a, when viewed from the front side. The support points 74a to 74c have support surfaces 75a to 75c, respectively. The support surfaces 75a to 75c (hereinafter, may be collectively referred to as a "support surface 75") are to support a bottom surface of the wafer boat 90, namely, a bottom surface of the bottom plate 92, in a contact manner. The support surfaces 75a to 75c have a flat surface, respectively. The support surface 75 is formed at an outer side of the support point 74. Locking structures 76a to 76c (hereinafter, may sometimes be collectively referred to as a "locking structure 76") are formed at an inner side of the support point 74. The locking structure 76 is locked to the opening 92a of the bottom plate 92 of the wafer boat 90 (see FIG. 5B), and has a shape in which the locking structure 76 is fitted in an inner diameter (namely, an outer diameter of the opening 92a) of the annular bottom plate 92. Specifically, the locking structure 76 protrudes upward from the outer upper side of the support surface 75, and supports an inner peripheral end portion of the annular bottom plate 92 at an angle defined by the support surface 75 and the locking structure 76. Thus, the annular bottom plate 92 is positioned and fixed. Further, in FIG. 5A, the support point 74 has a cylindrical shape but it may have various other shapes as long as it has the support surface 75 capable of horizontally supporting the bottom plate 92.

In addition, the wafer boat support table 70 supports the wafer boat 90 in a positional relationship in which the center O thereof is aligned with the center of the wafer boat 90.

In FIG. 5B, a positional relationship between the support points 74a to 74c and the bottom plate 92 and the posts 93a to 93c of the wafer boat 90 is illustrated. As illustrated in FIG. 5B, the respective support points 74a to 74c of the wafer boat support table 70 are disposed on linear lines L1 to L3 obtained by connecting the center O and the respective posts 74a to 74c of the wafer boat 90. This makes it possible for the support points 74a to 74c to evenly receive a load of the wafer W applied to the posts 93a to 93c, thereby eliminating an occurrence of inclination in supporting the wafer boat 90 and reducing particles generated due to friction or the like.

This will be described in detail below using a comparative example.

Figure 6A:
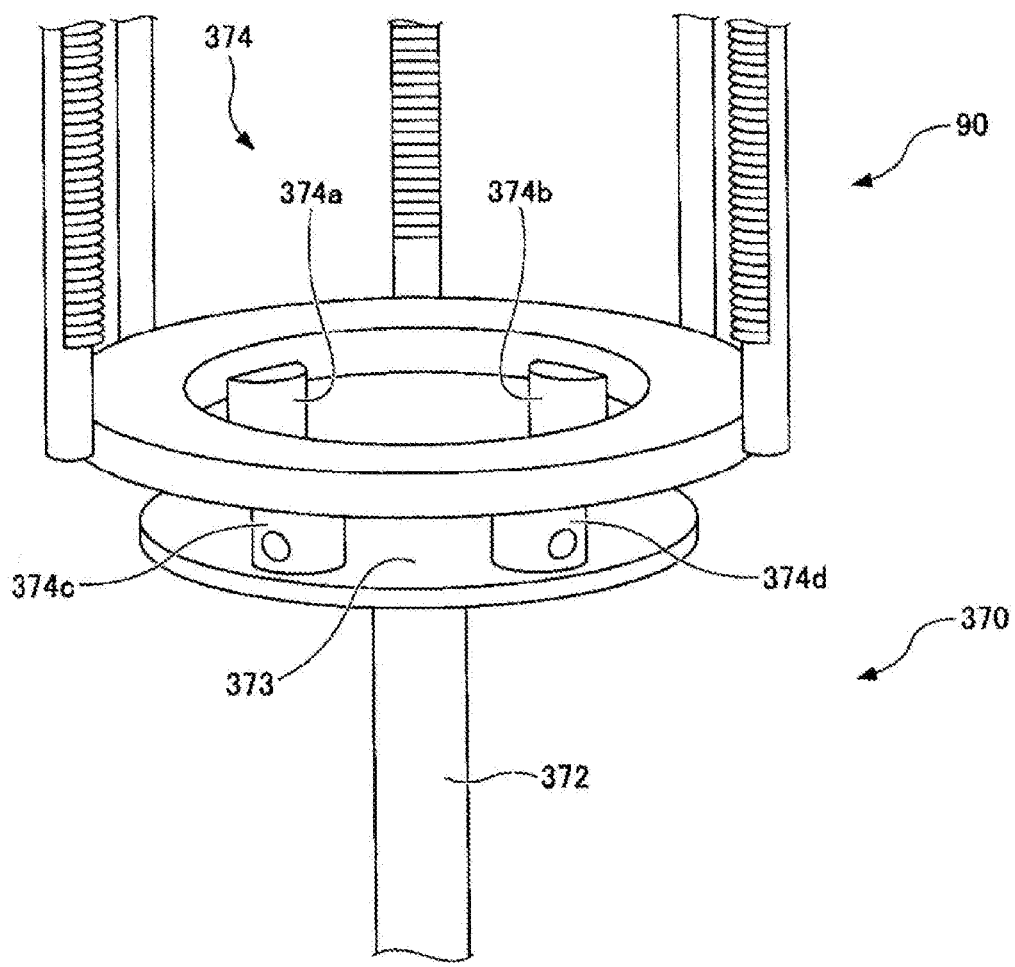
FIGS. 6A and 6B are views illustrating a wafer boat support table according to a comparative example, FIG. 6A being a view illustrating a configuration of an example of a wafer boat support table according to the comparative example, and FIG. 6B being a view illustrating a layout configuration of support points of the wafer boat support table according to the comparative example.
Figure 6B:
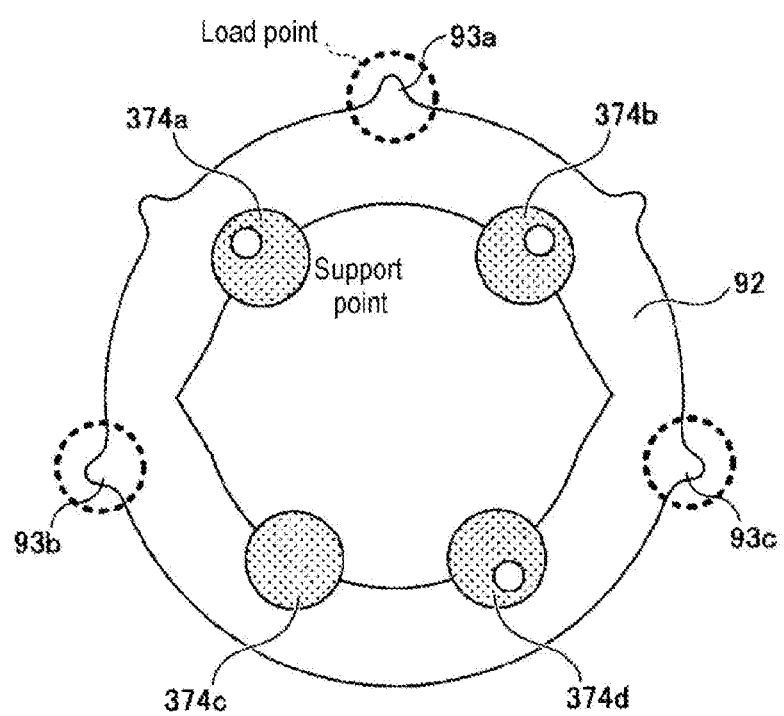

FIGS. 6A and 6B are views illustrating a wafer boat support table according to the comparative example. FIG. 6A is a view illustrating a configuration of an example of the wafer boat support table 370 according to the comparative example. As illustrated in FIG. 6A, the wafer boat support table 370 according to the comparative example includes four support points 374a to 374d on a support board 373, and supports the wafer boat 90 using the four support points 374a to 374d. Further, the same wafer boat as the wafer boat 90 according to the present embodiment described with reference to FIGS. 1 to 5 is used.

FIG. 6B is a view illustrating a layout configuration of the support points 374a to 374d of the wafer boat support table 370 according to the comparative example. As illustrated in FIG. 6B, the support points 374a to 374d support the annular bottom plate 92 in a formation close to a substantially square shape, and are disposed free of the posts 93a to 93c of the wafer boat 90, which are a load point of the wafer W.

Figure 7:
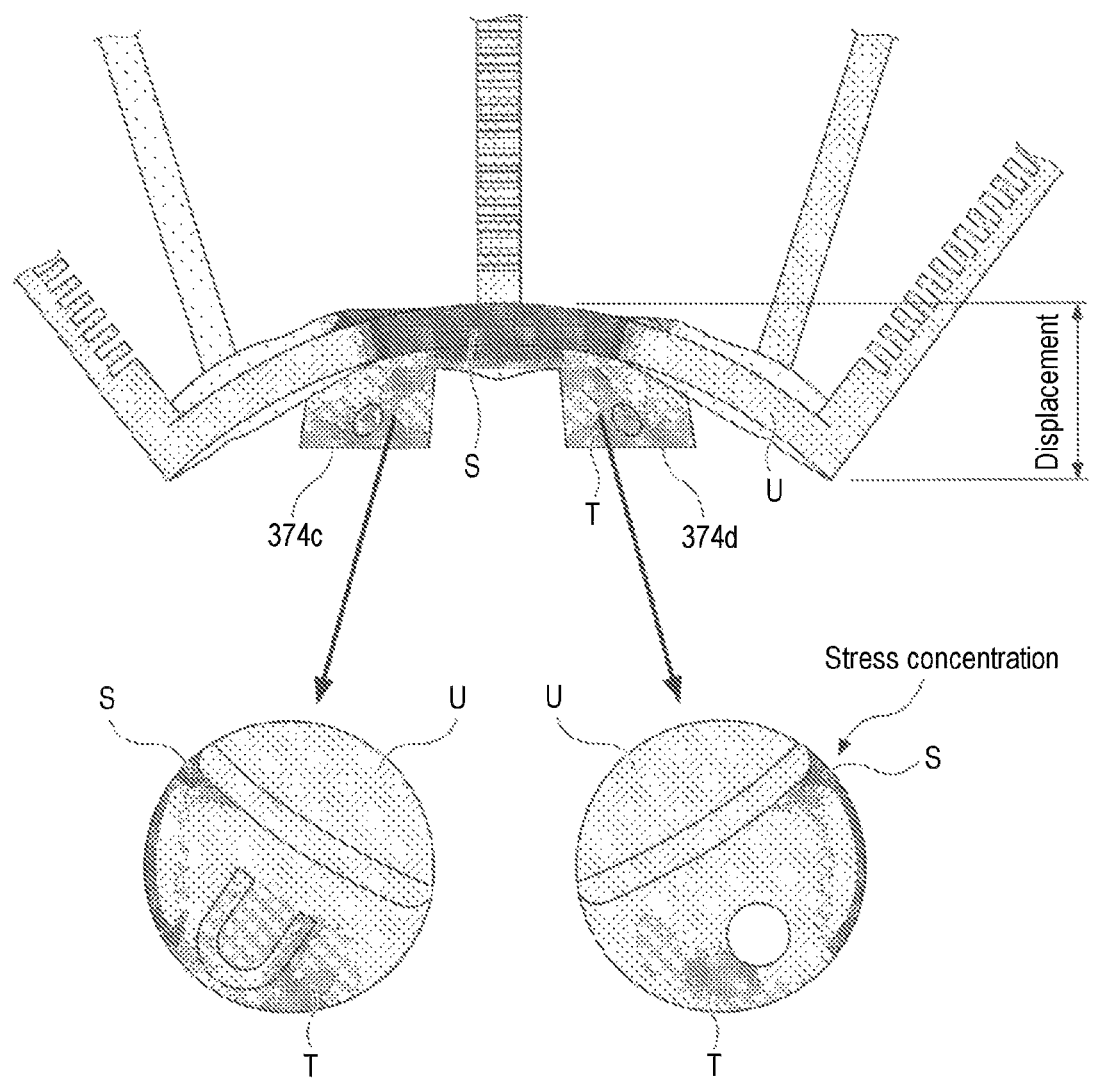
FIG. 7 is a view illustrating a stress distribution when a heat treatment is performed while the wafer boat support table according to the comparative example supports a wafer boat.

FIG. 7 is a view illustrating a stress distribution when the wafer boat support table 370 according to the comparative example performs a heat process while supporting the wafer boat 90. In FIG. 7, the lower side is a plane view illustrating a distribution of stress imposed to the support points 374c and 374d when viewed from the top. A level of the stress is expressed as regions S, T, and U. The level of the stress is increased in the order of the regions S, T, and U. In other words, the region S indicates the place where stress is concentrated.

As illustrated in FIG. 7, the bottom plate 92 of the wafer boat 90 is deformed (or displaced) due to heat and the load of the wafer W so that the outer side of the bottom plate 92 is bent to be hung downward.

By such a displacement, a contact area between the bottom surface of the wafer boat 90 and the support points 374a to 374d of the wafer boat support table 370 is reduced to cause the stress concentration. Actually, as illustrated in FIG. 7, stress is concentrated on the outer sides of the support points 374c and 374d, whereas a reduced stress is applied on inner sides of the support points 374c and 374d. In such a stress state, when the wafer boat support table 370 is formed of quartz and the wafer boat 90 is formed of SiC, they have different thermal expansion coefficients. This causes friction at the outer sides of the support points 374a to 347d, thereby generating particles of quartz from the outer sides of the support points 374a to 374d.

Figure 8A:
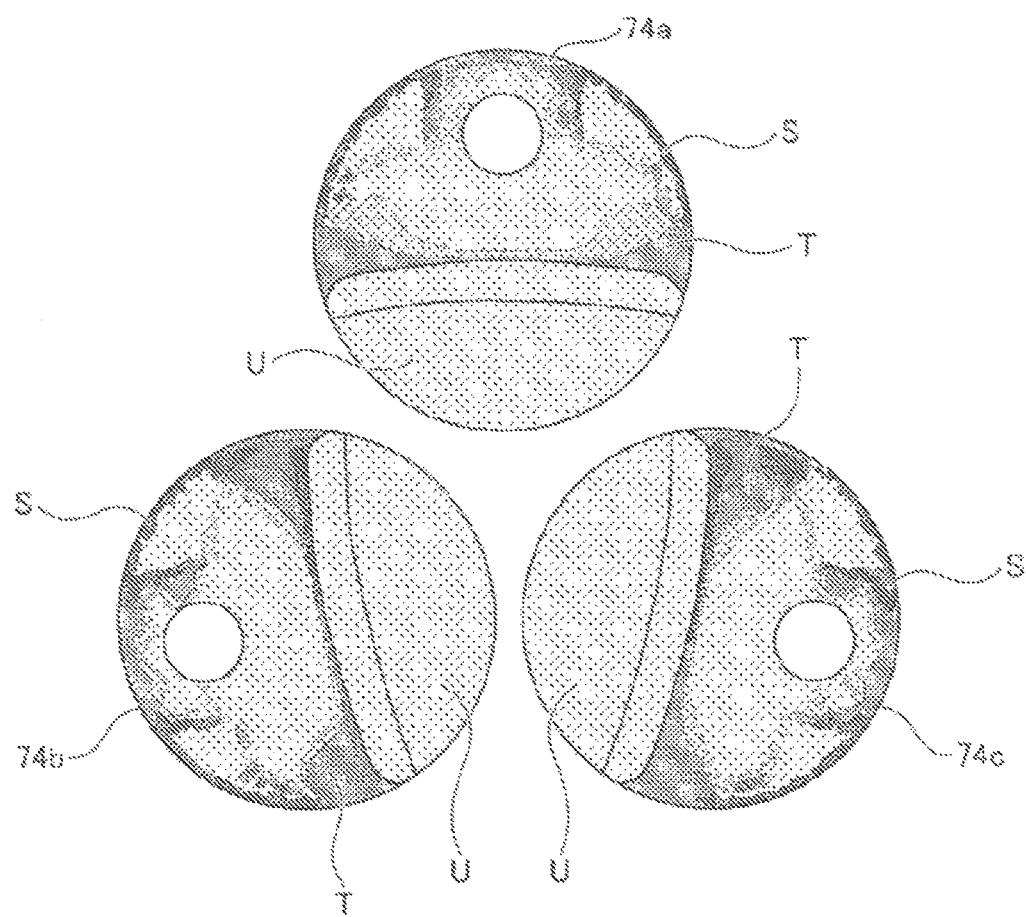
FIGS. 8A and 8B are views illustrating a stress distribution in respective support points of the wafer boat support table according to the first embodiment of the present disclosure and the wafer boat support table according to the comparative example, FIG. 8A being a view illustrating a stress distribution in respective support points of the wafer boat support table according to the first embodiment and FIG. 8B being a view illustrating a stress distribution in respective support points of the wafer boat support table according to the comparative example.
Figure 8B:
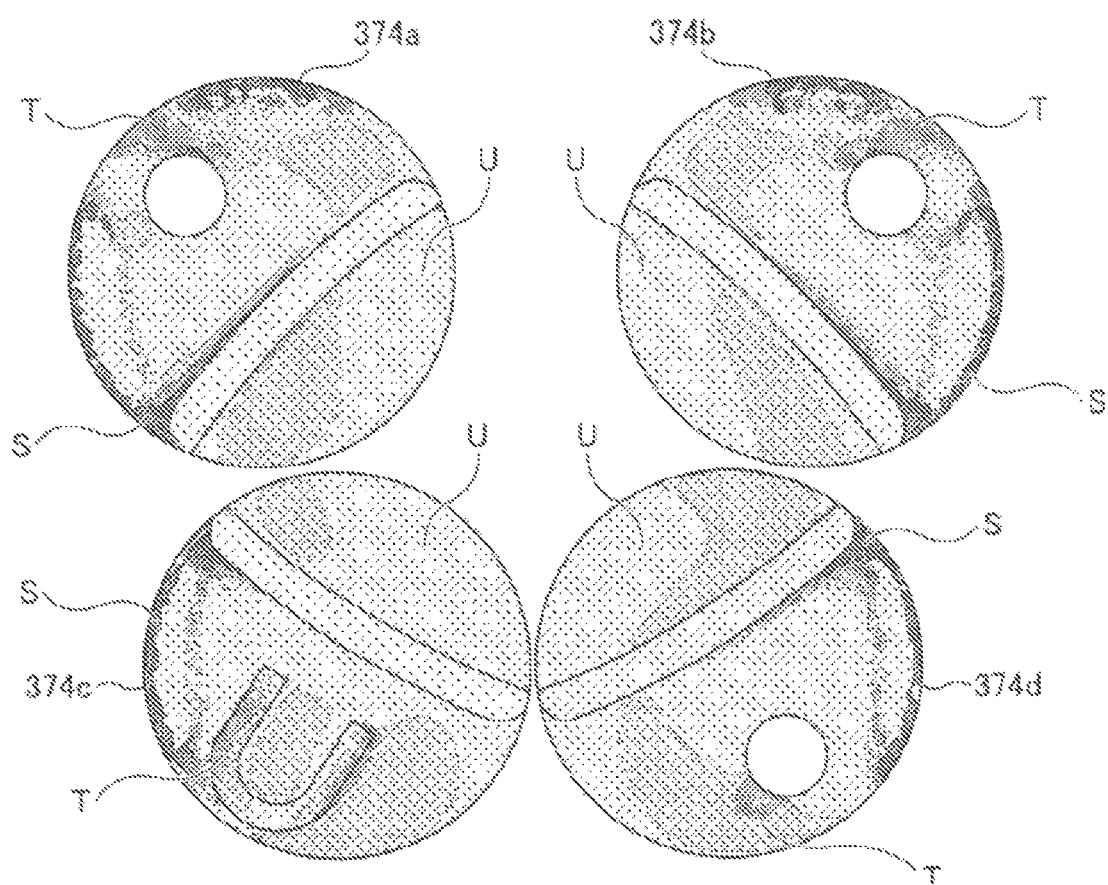

FIGS. 8A and 8B are views illustrating a stress distribution in respective support points of the wafer boat support table 70 according to the first embodiment of the present disclosure and the wafer board support table 370 according to the comparative example. FIG. 8A is a view illustrating a stress distribution in each of the support points 74a to 74c of the wafer boat support table 70 according to the first embodiment, and FIG. 8B is a view illustrating a stress distribution in each of the support points 374a to 374d of the wafer boat support table 370 according to the comparative example.

As illustrated in FIG. 8A, in the wafer boat support table 70 according to the first embodiment of the present disclosure, stress is distributed in a substantially bilaterally symmetric relationship with respect to the region S on which a high stress is imposed, when viewed from the center O. That is to say, it can be noted that the respective support points 74a to 74c are brought into contact in a bilaterally symmetric relationship with the bottom surface of the bottom plate 92 of the wafer boat 90.

Meanwhile, as illustrated in FIG. 8B, in the wafer boat support table 370 according to the comparative example, stress is distributed to be inclined to one side horizontally, rather than being distributed in a bilaterally symmetric relationship with respect to the annular shape. Such an inclined stress distribution causes contact places between the bottom surface of the wafer boat 90 and the support points 374a to 374d of the wafer boat support table 370 to be inclined, thereby generating particles of quartz due to the stress concentration.

FIG. 9 is a view illustrating a simulation analysis result of a relationship between a displacement of the bottom surface of the wafer boat and a maximum stress value in the first embodiment. As illustrated in FIG. 9, an analysis result P of the wafer boat support table 70 according to the first embodiment of the present disclosure shows that both a displacement of the bottom surface and the maximum stress value are reduced, compared with an analysis result R of the wafer boat support table 370 according to the comparative example. The number of the support points 374a to 374d of the wafer boat support table 370 according to the comparative example is four, whereas the number of the support points 74a to 74c of the wafer boat support table 70 according to the first embodiment is reduced to three. In consideration of the fact that, in spite of the reduced number, the support points 74a to 74c of the wafer boat support table 70 according to the first embodiment evenly receive stress, an effect of improvement is considered to be very large.

In this manner, according to the wafer boat support table 70 of the first embodiment of the present disclosure, by disposing the support points 74a to 74c at the load point of the wafer boat 90, namely, on the respective linear lines L1 to L3 obtained by connecting the posts 93a to 93c and the center O, it is possible to evenly distribute stress on the support surfaces 75a to 75c of the respective support points 74a to 74c, thereby reducing inclination of stress. Thus, it is possible to reduce the generation of particles resulting from the inclination of stress.

Further, in this embodiment, there has been described, by way of example, the case where the number of the posts 93 of the wafer boat 30 is three, the present disclosure is not limited thereto. In some embodiments, even when the number of the posts 93 is another number, the same effect may be obtained by disposing the support point 74 on the respective linear lines obtained by connecting the support point 93 and the center O. For example, when the number of the posts 93 is four, the same effect may be obtained by disposing the support point 74 on four respective linear lines obtained by connecting the center O and the post 93.

Figure 10A:
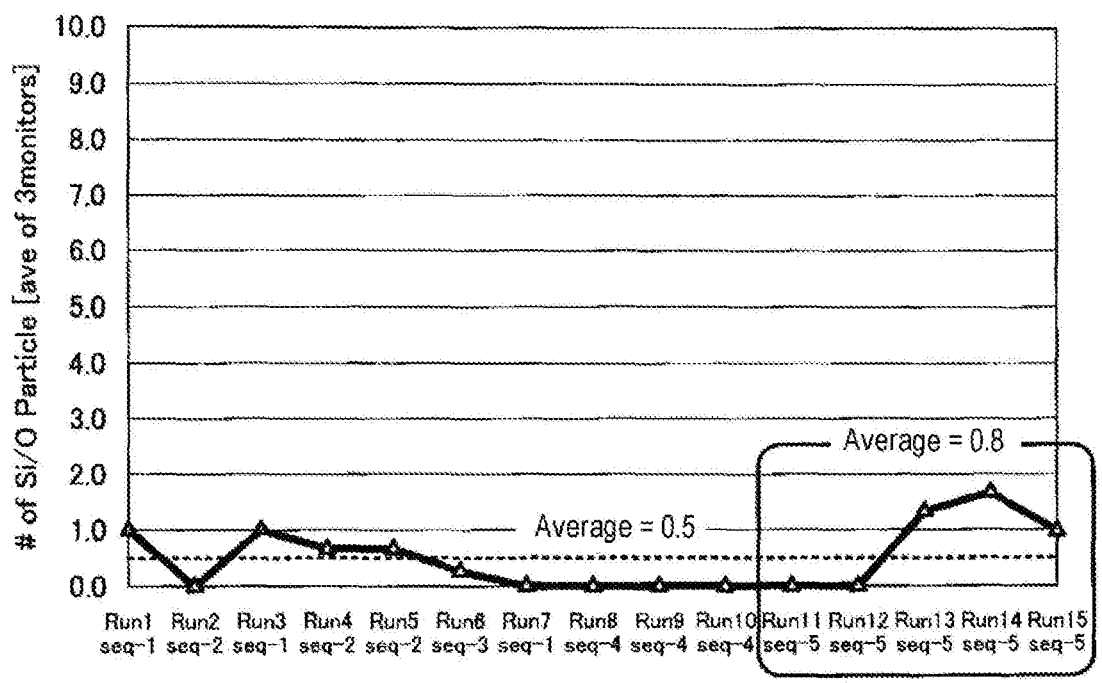
FIGS. 10A and 10B are views illustrating a comparison result of particles generated when the wafer boat support table according to the first embodiment and the wafer boat support table according to the comparative example are applied, FIG. 10A illustrating an example in which the wafer boat support table according to the first embodiment is applied, and FIG. 10B being an example in which the wafer boat support table according to the comparative example is applied.
Figure 10B:
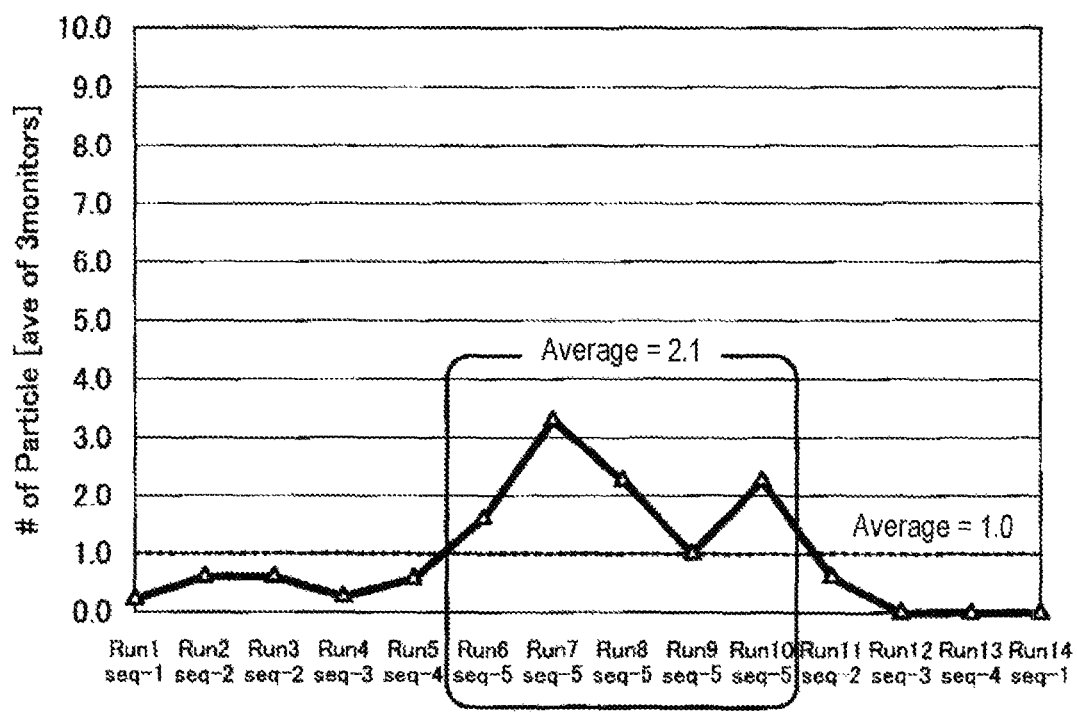

FIGS. 10A and 10B are views illustrating a comparison result of particles generated when the wafer boat support table 70 according to the first embodiment and the wafer boat support table 370 according to the comparative example are applied. FIG. 10A is an example in which the wafer boat support table according to the first embodiment is applied, and FIG. 10B is an example in which the wafer boat support table according to the comparative example is applied. In FIGS. 10A and 10B, the horizontal axis represents the number of operations (run number) and the vertical axis represents the number of particles.

As illustrated in FIG. 10A, in the example in which the wafer boat support table 70 according to the first embodiment is applied, the number of particles of the overall average was 0.5. Further, even in a local process in which the number of particles is maximum, the average number of particles was 0.8.

Meanwhile, as illustrated in FIG. 10B, in the example in which the wafer board support table 370 according to the comparative example is applied, the number of particles of the overall average was 1.0. Further, even in a local process in which the number of particles is maximum, the average number of particles was 2.1.

As described above, from the example in which the wafer boat support table 70 according to the first embodiment is applied, it can be noted that the number of generated particles is significantly reduced by, e.g., half of that in the comparative example on average, and by about ⅓ even in the local process in which the number of particles is large.

Figure 11B:
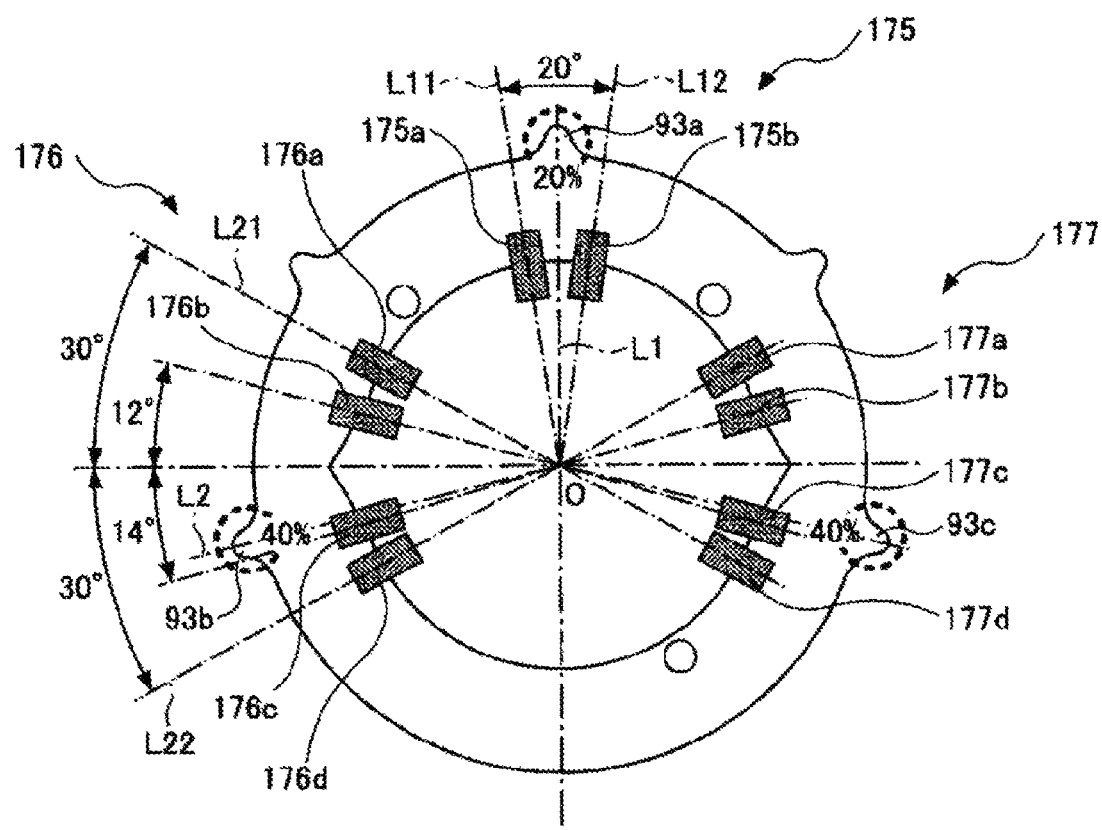

FIGS. 11A and 11B are views illustrating an example of a wafer boat support table 170 according to a second embodiment of the present disclosure. FIG. 11A is a perspective view illustrating a configuration of the example of the wafer boat support table 170 according to the second embodiment of the present disclosure.

As illustrated in FIG. 11A, the wafer boat support table 170 according to the second embodiment is similar in configuration to the wafer boat support table 70 according to the first embodiment, in that the wafer boat support table 170 includes the base portion 71, the support shaft 72, and the support board 73 as described above. Further, the aforementioned components are the same as those of the first embodiment, and therefore, the same reference numerals are used for the same components.

Meanwhile, the wafer boat support table 170 according to the second embodiment is different from the wafer boat support table 70 according to the first embodiment, in that the wafer boat support table 170 includes a cylindrical support barrel 174 installed on the support board 73 and three support point groups 175, 176, and 177 installed on the support barrel 174. Each of the support point groups 175 to 177 includes a plurality of support points, respectively. The support point group 175 is composed of two support points 175a and 175b, the support point group 176 is composed of four support points 176a to 176d, and the support point group 177 is composed of four support points 177a to 177d.

Further, each of the support points 175a, 175b, 176a to 176d, and 177a to 177d has a support surface and a locking structure 179. The locking structure 179 is installed at an inner side of each of the support points 175a, 175b, 176a to 176d, and 177a to 177d, and the support surface 178 is installed at an outer side of each of the support points 175a, 175b, 176a to 176d, and 177a to 177d. The support surface 178 is brought into contact with the bottom surface of the bottom plate 92 of the wafer boat 90, and has a flat surface. The locking structure 179 is fitted to the annular inner periphery of the bottom plate 92, and has the same function as that of the locking structure 76 of the wafer boat support table 70 according to the first embodiment.

FIG. 11B is a view illustrating an example of a layout configuration of the support point groups and each of the support points. As illustrated in FIG. 11B, the support point group 175 is installed to correspond to the post 93a of the wafer boat 90, and is installed around a linear line L1 defined by connecting the center O and the post 93a. The two support points 175a and 175b constituting the support point group 175 are installed in a bilaterally symmetric relationship at both sides of the linear line L1 defined by connecting the center O and the post 93a. The support points 175a and 175b are installed to receive a load applied to the post 93a in an evenly distributed manner. For this reason, the support points 175a and 175b are installed around the linear line L defined by connecting the center O and the post 93a in order to receive the load applied toward the linear line L1 at the vicinity of the linear line L1 in a distributed manner, rather than being disposed on the linear line L1. In other words, if any one of the support points 175a and 175b is installed on the linear line L1, stress is concentrated on the support points 175a or 175b disposed on the linear line first wiring L1. Thus, the support points 175a and 175b are installed around the linear line L1 rather than the linear line L1 itself. Further, in FIG. 11B, an angle between a linear line L11 defined by connecting the support point 175a and the center O and a linear line L12 defined by connecting the support point 175b and the center O is set to 20 degrees. This angle may be appropriately set depending on usage or stress distribution situations.

In addition, the support point group 176 is composed of the four support points 176a to 176d. Each of the support points 176a to 176d is disposed around a linear line L2 defined by connecting the post 93b and the center O, rather than linear line L2 itself. Among the four support points 176a to 176d, the two support points 176a and 176b are disposed inward of the linear line L2, and the other two support points 176c and 176d are disposed outward of the linear line L2. In this manner, the support points 176a to 176d may be disposed at the equally divided number at both sides of the linear line L2 defined by connecting the post 93b and the center O. With this disposition, it is easier to evenly distribute a load applied to the post 93b. Further, as illustrated in FIG. 11B, the support points 176c and 177c are disposed around the linear line L2, and the centers of the support points 176c and 177c are positioned to be slightly displaced outward of the linear line L2. This makes it possible to properly distribute load. This will be described in detail with reference to FIG. 12.

Also, in FIG. 11B, an angle between linear lines L21 and L22 defined by connecting the outwardly-disposed (inwardly and forwardly-disposed) support points 176a and 176d and the center O is set to 30 degrees. Similarly, this angle may be set to various values depending on usage or stress distribution situations. However, in the wafer boat support table 170 according to the second embodiment, various analysis results show that an opening angle between the outwardly-disposed support points 176a and 176d is set to 30 degrees to obtain an optimal condition. This will be described later.

Further, it can be seen that, in the wafer boat 90 including three posts 93a to 93c, a load to be applied to the post 93a disposed at the central inner side is 20%, and loads to be applied to the posts 93b and 93c disposed at the left and right sides are 40%, respectively. An opening angle between the outwardly-disposed support points 176a and 176d is also determined in consideration of this fact.

Similarly, the support point group 177 disposed at the right side is composed of four support points 177a to 177d, like the support point group 176 disposed at the left side. The support points 177a to 177d are disposed in a bilaterally symmetric relationship with the left support points 176a to 176d with reference to the center O or the support point group 175. Therefore, the description of the left support point group 176 and each of the support points 176a to 175d included in the support point group 176 may be similarly made on the right support point group 177 and the support points 177a to 177d included in the support point group 177. Thus, the description of the right support point group 177 and the four support points 177a to 177d will be omitted.

Figure 12:
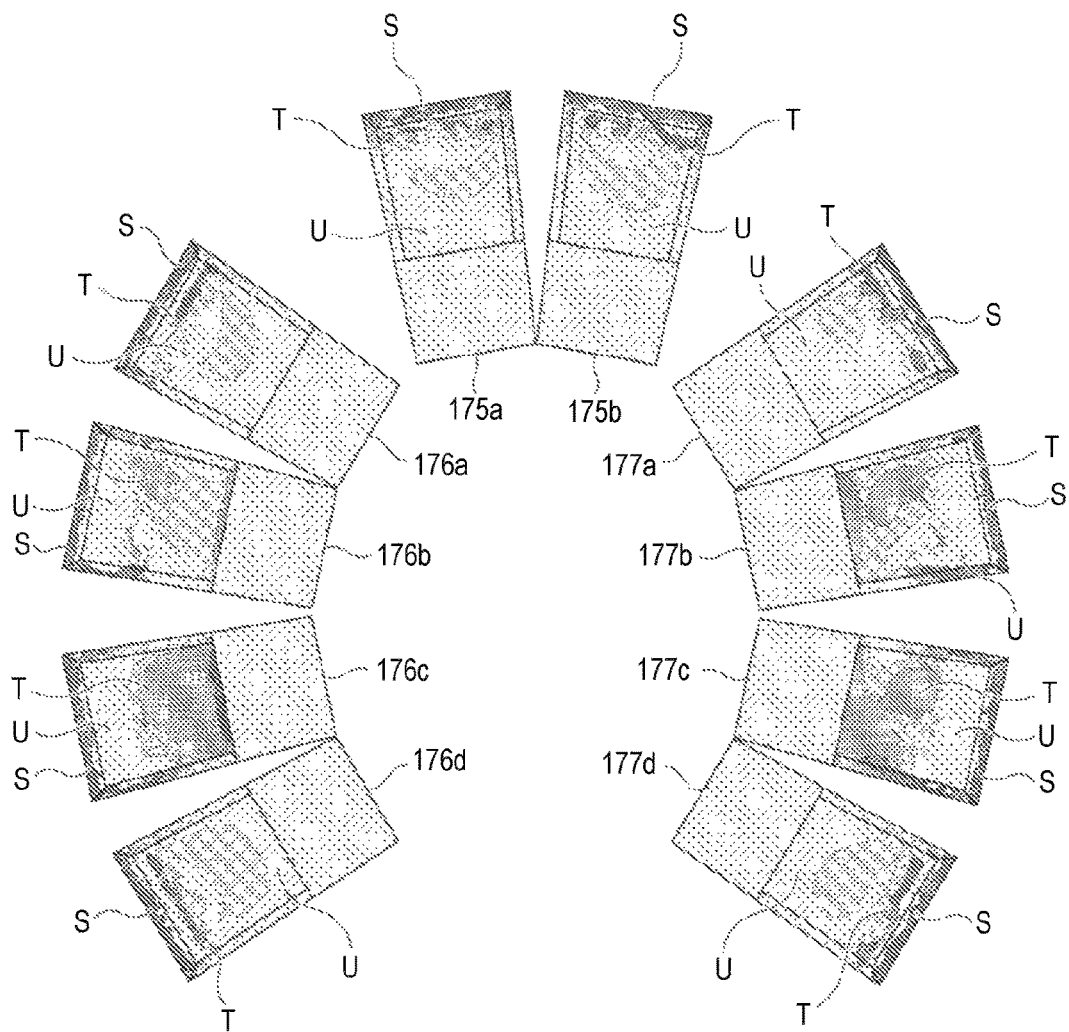
FIG. 12 is a view illustrating a stress distribution of respective support points of the wafer boat support table according to the second embodiment of the present disclosure.

FIG. 12 is a view illustrating a stress distribution in each of the support points 175a, 175b, 176a to 176d, and 177a to 177d of the wafer boat support table 170 according to the second embodiment. Also, the regions S, T, and U indicated in FIG. 12 are represented in the order of stress strength, like FIGS. 7 and 8. As illustrated in FIG. 12, it can be seen that the region S having high stress is substantially evenly distributed to each of the ten support points 175a, 175b, 176a to 176d, and 177a to 177d. In this manner, according to the wafer boat support table 170 of the second embodiment, stress can be evenly imposed on each of the ten support points 175a, 175b, 176a to 176d, and 177a to 177d.

FIG. 13 is a view illustrating a simulation analysis result of a relationship between a displacement of a bottom surface of a wafer boat and a maximum stress value in the second embodiment. As illustrated in FIG. 13, the analysis result Q of the wafer boat support table 170 according to the second embodiment of the present disclosure shows that both the displacement of the bottom surface and the maximum stress value are significantly reduced and the maximum stress value is lowered by about 50%, compared with the analysis result R of the wafer boat support table 370 according to the comparative example. The reason for this is that, as illustrated in FIG. 11B, since the left and right posts 93b and 93c occupies 80% in a load balance of the wafer boat 90, two sets of the four support points 176a to 176d and 177a to 177d are respectively disposed in the vicinity of the left and right posts 93b and 93c, to mainly support the and right posts 93b and 93c. Thus, it is possible to reduce stress by a significant amount.

Figure 14A:
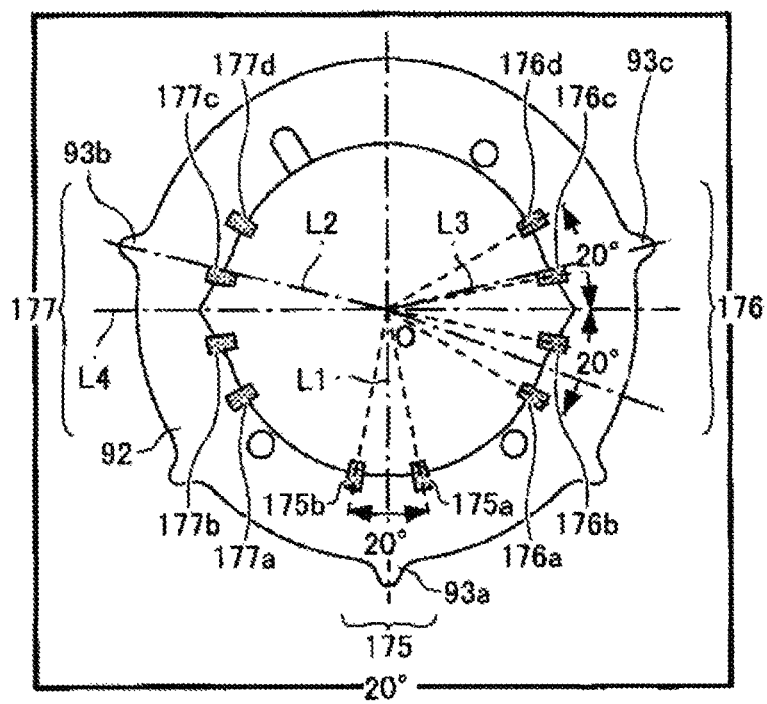
FIGS. 14A to 14D are views illustrating aspects when angles between outwardly-disposed support points in left and right support point groups of the wafer boat support table according to the second embodiment of the present disclosure are variously changed, FIG. 14A being a view illustrating an aspect when an angle between outwardly-disposed support points of an outwardly-disposed support point group is set to 20 degrees, FIG. 14B being a view illustrating an aspect when an angle between outwardly-disposed support points of the outwardly-disposed support point group is set to 30 degrees, FIG. 14C being a view illustrating an aspect when an angle between outwardly-disposed support points of the outwardly-disposed support point group is set to 40 degrees, and FIG. 14D being a view illustrating an aspect having an optimal result in analysis when an angle between outwardly-disposed support points of the outwardly-disposed support point group is set to 30 degrees.
Figure 14B:
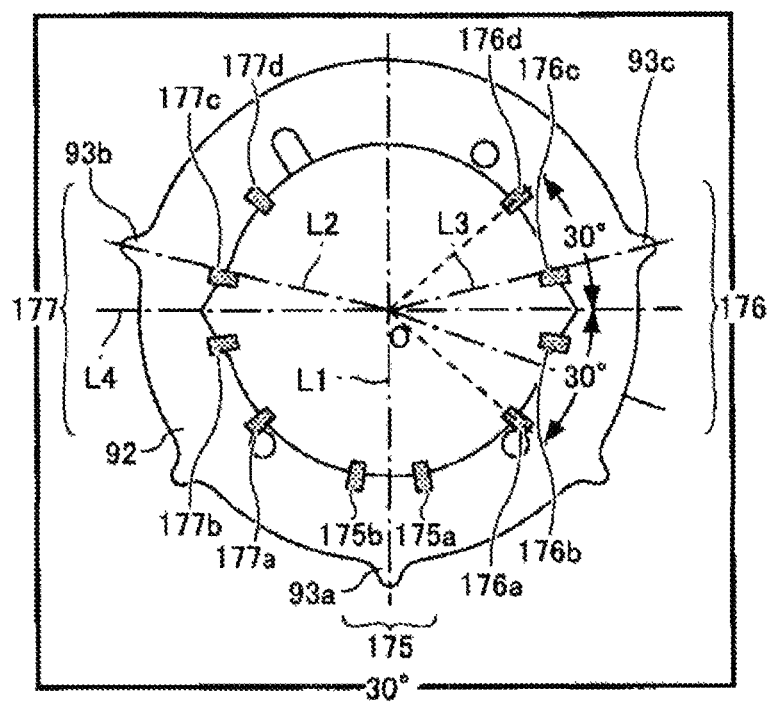
Figure 14C:
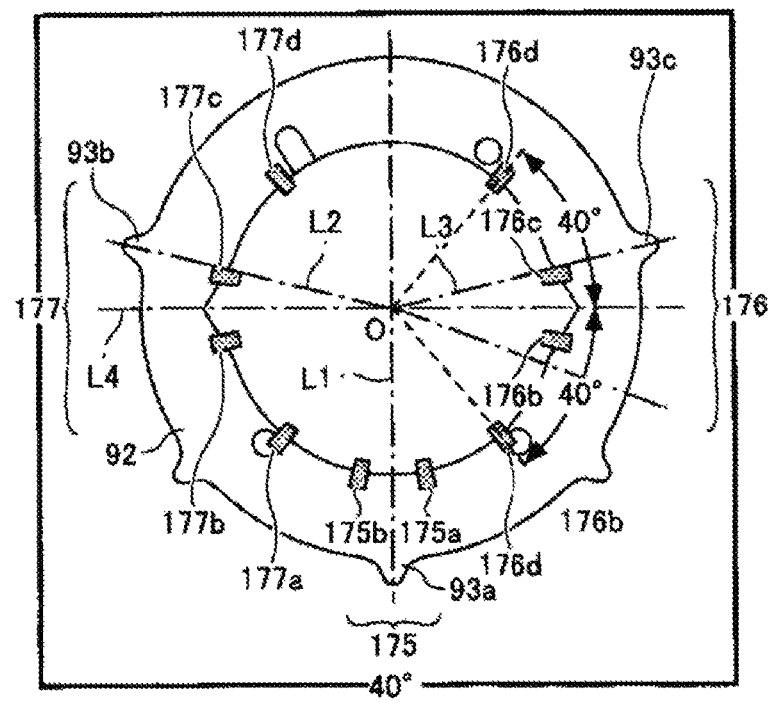
Figure 14D:
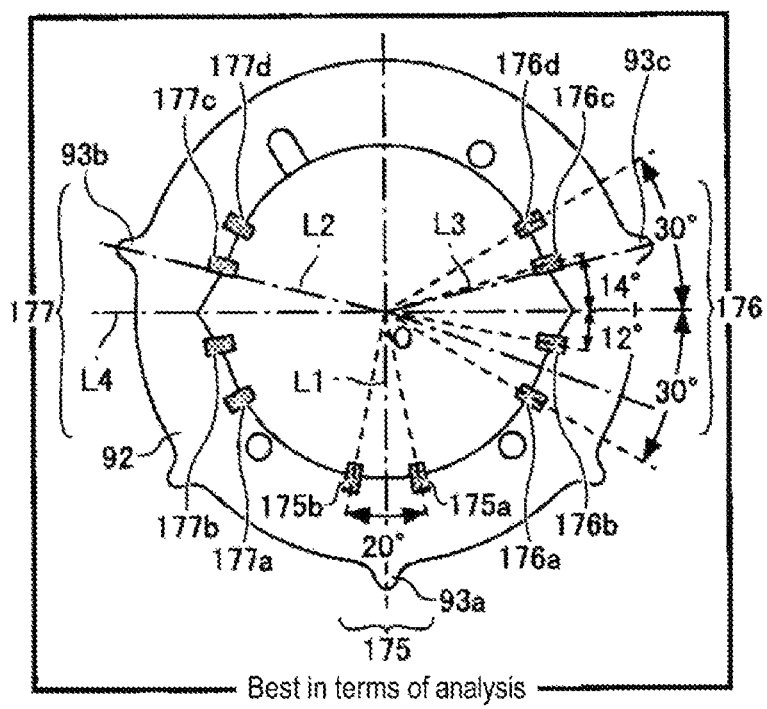

FIGS. 14A to 14D are views illustrating aspects in which angles between the outwardly-disposed support points in the left and right support point groups of the wafer boat support table according to the second embodiment of the present disclosure are varied to various values. FIG. 14A is a view illustrating an aspect in which an angle between the outwardly-disposed support points 176a and 176d of the support point group 176 and an angle between the outwardly-disposed support points 177a and 177d of the support group 177 are set to 20 degrees, respectively. FIG. 14B is a view illustrating an aspect in which an angle between the outwardly-disposed support points 176a and 176d of the support point group 176 and an angle between the outwardly-disposed support points 177a and 177d of the support group 177 are set to 30 degrees, respectively. FIG. 14C is a view illustrating an aspect in which an angle between the outwardly-disposed support points 176a and 176d of the support point group 176 and an angle between the outwardly-disposed support points 177a and 177d of the support group 177 are set to 40 degrees, respectively. FIG. 14D is a view illustrating an aspect in which an angle between the outwardly-disposed support points 176a and 176d of the support point group 176 and an angle between the outwardly-disposed support points 177a and 177d of the support group 177 are set to 30 degrees, respectively. The aspect of FIG. 14D manifests an analytically optimal result.

As illustrated in FIGS. 14A to 14C, the simulation analysis of stress distributions was performed by setting the angles between the outwardly-disposed support points 176a and 176d and the outwardly-disposed support points 177a and 177d in each of the support point groups 176 and 177 to 20, 30, and 40 degrees, respectively.

As a result, as illustrated in FIG. 14D, it can be noted that the aspect in which the angle is set to 30 degrees shows the stress maximum value at the lowest level. More specifically, as illustrated in FIG. 14D, providing that a linear line L1 defined by connecting the post 93a and the center O as the origin point is a Y axis, an angle between a linear line L4 as an X axis and the support point 175b is set to 12 degrees and an angle between the linear line L4 and the support point 176c is set to 14 degrees, so that the stress maximum value was lowest.

Figure 15:
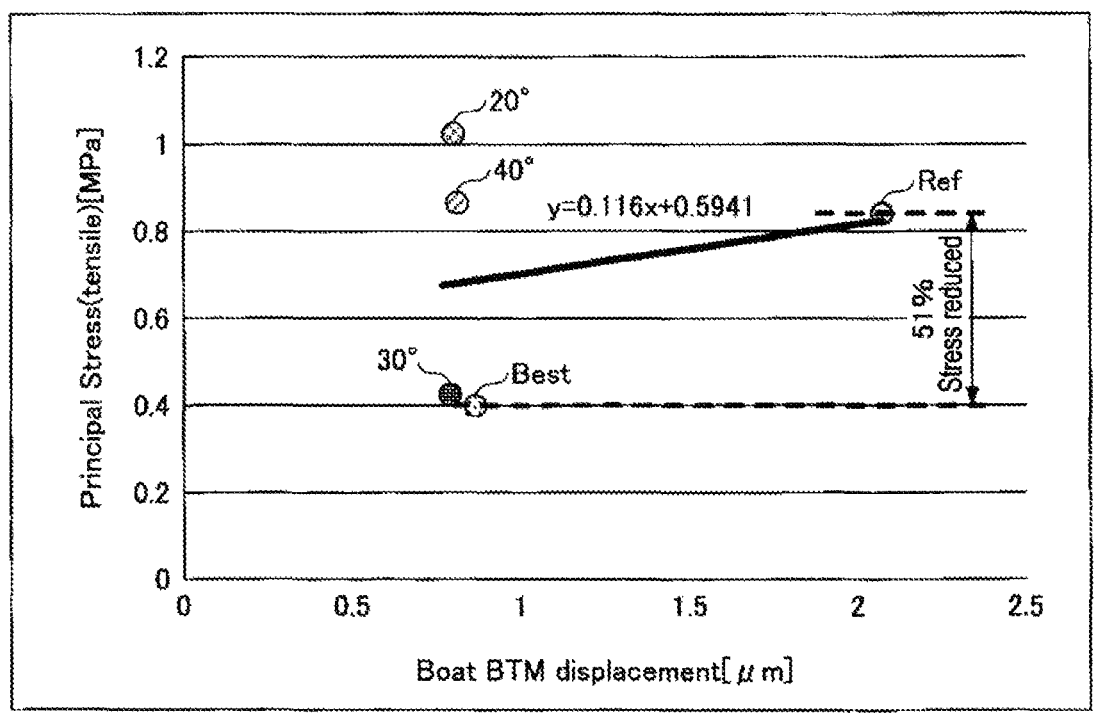
FIG. 15 is a view illustrating an analysis result of each aspect of FIGS. 14A to 14D.

FIG. 15 is a view illustrating an analysis result of each aspect of FIGS. 14A to 14D. In FIG. 15, the horizontal axis represents a displacement of the bottom plate 92 of the wafer boat 90, and the vertical axis represents stress applied to the support points 175 to 177, 374. As illustrated in FIG. 15, even in the case where angles (hereinafter, may be referred to as "opening angles") between the outwardly-disposed support points 176a and 176d and the outwardly-disposed support points 177a and 177d of each of the support point groups 176 and 177 are set to 20, 30, and 40 degrees, respectively, a displacement of the bottom plate 92 was significantly reduced by a level of 1 μm or more, compared with the comparative example in which the four support points 374a to 374d are provided.

Meanwhile, when the opening angle was 30 degrees, stress was reduced at a level of 51% which is the highest level, compared with the comparative example. Further, when the opening angles were 20 and 40 degrees, stress itself was higher than that of the comparative example, while the displacement of the bottom plate 92 of the wafer boat 90 was significantly small as mentioned above, compared with the comparative example. Thus, a generation amount of particles was reduced compared with the comparative example. Therefore, any cases where the opening angles are set to 20 and 40 degrees are included in the embodiment of the present disclosure.

According to some embodiments of the present disclosure, it is possible to reduce generation of particles.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A heat treatment apparatus comprising:
   a wafer boat having a plurality of posts from below, the plurality of posts being configured to arrange and support a plurality of wafers at intervals in a vertical direction; and
   a wafer boat support table which supports the wafer boat, and including a plurality of support points installed on each of linear lines defined by connecting a center of the wafer boat and the plurality of posts and configured to support a bottom surface of the wafer boat while being brought into contact with the bottom surface of the wafer boat,
   wherein each of the plurality of support points is installed to correspond to the plurality of posts.

2. The heat treatment apparatus of claim 1, wherein the wafer boat support table further includes a support board having a disk shape, and
   wherein each of the plurality of support points protrudes upward from the support board, and has a flat support surface.

3. The heat treatment apparatus of claim 2, wherein the bottom surface of the wafer boat has a circular ring shape with a circular opening formed at a center thereof, and
   each of the plurality of support points has a locking structure formed at an inner side of each of the plurality of support points and configured to be fitted to the circular opening and the flat support surface formed at an outer side of each of the plurality of support points.

4. The heat treatment apparatus of claim 1, wherein the number of the plurality of posts installed in the wafer boat is three, and
   the number of the plurality of support points installed to correspond to the plurality of posts is three.

5. The heat treatment apparatus of claim 4, wherein one of the plurality of support points is installed inward beyond a center portion of the wafer boat when viewed from a front side through which the wafer is loaded into the wafer boat, and the other two support points are installed in a bilaterally symmetric relationship with respect to the one support point.

6. The heat treatment apparatus of claim 1, wherein each of the plurality of support points is formed of a material different from that of the wafer boat.

7. The heat treatment apparatus of claim 6, wherein the wafer boat is formed of SiC, and each of the plurality of support points is formed of quartz.

8. The heat treatment apparatus of claim 1, further comprising:
   a wafer transfer part configured to load a wafer into a wafer boat supported by the wafer boat support table;
   a heat processing furnace disposed on the wafer boat support table; and
   an elevating mechanism configured to load the wafer boat supported by the wafer boat support table into the heat processing furnace.

9. A heat treatment apparatus:
   a wafer boat having a plurality of posts from below, the plurality of posts being configured to arrange and support a plurality of wafers at intervals in a vertical direction; and
   a wafer boat support table which supports the wafer boat, and including a plurality of support points disposed around each of linear lines defined by connecting a center of the wafer boat and the plurality of posts and configured to support a bottom surface of the wafer boat while being brought into contact with the bottom surface of the wafer boat,
   wherein the number of the plurality of posts installed in the wafer boat is three,
   one of the plurality of posts is installed inward beyond a center portion of the wafer boat when viewed from a front side through which the wafer is loaded into the wafer boat, and the other two posts are installed in a bilaterally symmetric relationship with respect to the one post, and
   two of the plurality of support points are installed around the one post, and four of the plurality of support points are installed around each of the other two posts.

10. The heat treatment apparatus of claim 9, wherein the plurality of support points are disposed to distribute a load applied to each of the plurality of posts.

11. The heat treatment apparatus claim 9, wherein the wafer boat support table further includes a support board having a disk shape,
    wherein each of the plurality of support points protrudes upward from the support board, and has a flat support surface.

12. The heat treatment apparatus of claim 11, wherein the bottom surface of the wafer boat has a circular ring shape with a circular opening formed at a center thereof, and
    each of the plurality of support points has a locking structure formed at an inner side of each of the plurality of support points and configured to be fitted to the circular opening and the flat support surface formed at an outer side of each of the plurality of support points.

13. The heat treatment apparatus of claim 9, wherein an angle between two outwardly-disposed support points in the four support points installed around each of the other two posts and the center of the support board falls within a range of 20 to 40 degrees.

14. The heat treatment apparatus of claim 13, wherein the angle between the two outwardly-disposed support points and the center of the support board is approximately 30 degrees.

15. The heat treatment apparatus of claim 9, wherein an angle between the two support points installed around the one post and the center of the support board is approximately 20 degrees.

16. The heat treatment apparatus of claim 9, wherein each of the plurality of support points is formed of a material different from that of the wafer boat.

17. The heat treatment apparatus of claim 16, wherein the wafer boat is formed of SiC, and each of the plurality of support points is formed of quartz.

18. The heat treatment apparatus of claim 9, further comprising:

a wafer transfer part configured to load a wafer into a wafer boat supported by the wafer boat support table;

a heat processing furnace disposed on the wafer boat support table; and an elevating mechanism configured to load the wafer boat supported by the wafer boat support table into the heat processing furnace.

* * * * *